US006882186B2

(12) United States Patent
Nishitoba

(10) Patent No.: US 6,882,186 B2
(45) Date of Patent: Apr. 19, 2005

(54) DRIVING CIRCUIT AND CONSTANT CURRENT DRIVING APPARATUS USING THE SAME

(75) Inventor: Shigeo Nishitoba, Tokyo (JP)

(73) Assignee: NEC Corporation, Tokyo (JP)

( * ) Notice: Subject to any disclaimer, the term of this patent is extended or adjusted under 35 U.S.C. 154(b) by 77 days.

(21) Appl. No.: 10/026,466

(22) Filed: Dec. 27, 2001

(65) Prior Publication Data

US 2002/0084812 A1 Jul. 4, 2002

(30) Foreign Application Priority Data

Dec. 28, 2000 (JP) ....................................... 2000-401486

(51) Int. Cl.[7] ................................................ H03B 1/00
(52) U.S. Cl. ....................................... 327/108; 327/538
(58) Field of Search ......................... 327/108–112, 403, 327/404, 405, 530, 538–543; 323/312–315; 345/75.2; 326/82, 83, 89

(56) References Cited

U.S. PATENT DOCUMENTS 5,672,993 A 9/1997 Runaldue .................... 327/404
5,767,698 A * 6/1998 Emeigh et al. ............... 326/83
5,808,508 A * 9/1998 Castellucci et al. ......... 327/538
6,229,376 B1 * 5/2001 Geysen ....................... 327/403
6,326,836 B1 * 12/2001 Kipnis ........................ 327/538
6,332,661 B1 * 12/2001 Yamaguchi ................. 327/108
6,384,638 B1 * 5/2002 Nayebi et al. ................ 327/65

FOREIGN PATENT DOCUMENTS

JP 2000-293245 10/2000

OTHER PUBLICATIONS

Adel S. Sedra and Kenneth C. Smith, "Microelectronics Circuits, Third Edition," Saunders College Publishing, 1991, p. 432.

* cited by examiner

*Primary Examiner*—Terry D. Cunningham
*Assistant Examiner*—Long Nguyen
(74) *Attorney, Agent, or Firm*—McGinn & Gibb, PLLC

(57) ABSTRACT

Each of a plurality of driving circuits constituting a constant current driving apparatus is composed of a first current mirror circuit and a second current mirror circuit. The first current mirror circuit outputs a plurality of output currents, each of which corresponds to a reference current. Accordingly, the variation in the output current can be reduced between the driving circuits adjacent to each other.

15 Claims, 15 Drawing Sheets

DRIVING CIRCUIT AND CONSTANT CURRENT DRIVING APPARATUS USING THE SAME

BACKGROUND OF THE INVENTION

1. Field of the Invention

The present invention relates to a driving circuit and a constant current driving apparatus using the same.

2. Description of the Related Art

Conventionally, a driving circuit which has a current mirror circuit has been used in order to drive a load at a constant current. FIG. 1 shows an example of such a conventional driving circuit. This driving circuit is composed of a current mirror circuit and a reference current setting resistor R.

The current mirror circuit is composed of a plurality of PNP transistors $Tr_0$ to $Tr_n$. In this current mirror circuit, it is assumed that a power supply terminal and the respective PNP transistors $Tr_0$ to $Tr_n$ are physically arranged at positions shown in FIG. 1. In short, the PNP transistor $Tr_0$ is physically arranged at the closest position to the power supply terminal, and the PNP transistor $Tr_n$ is physically arranged at the farthest position from the power supply terminal.

Bases of the plurality of PNP transistors $Tr_0$ to $Tr_n$ are connected to each other. Emitters are commonly connected through a common power supply line to the power supply terminal, and collectors are connected to output terminals $O_1$ to $O_n$, respectively. The base of the PNP transistor $Tr_0$ arranged at a first stage of this current mirror circuit is connected to the collector of the PNP transistor $Tr_0$ so that a so-called diode coupling is established.

In this current mirror circuit, a current of which value is substantially equal to that flowing through the collector of the PNP transistor $Tr_0$, is flowed through each of the collectors of the PNP transistors $Tr_1$ to $Tr_n$, and outputted as output currents from the output terminals $O_1$ to $O_n$. Accordingly, a load that is set at an independent potential is current-driven. The collector of the PNP transistor $Tr_0$ arranged at the first stage is connected through the reference current setting resistor R to a ground.

This reference current setting resistor R enables a reference current $I_{ref}$ flowing through the collector of the PNP transistor $Tr_0$ to be adjusted. Thus, the suitable selection of the value of the reference current setting resistor R enables a current having a desired value to flow through the output terminals $O_1$ to $O_n$. Hence, it is possible to drive a load requiring a constant current drive. This conventional driving circuit is generally configured, for example, as one semiconductor integrated circuit (IC).

Recently, as the load requiring the constant current drive, there are an LED display panel composed by arraying a plurality of light emitting diodes (hereafter, referred to as "LED"), an organic electroluminescence (hereafter, referred to as "EL") display panel composed by arraying a plurality of organic EL elements using the electroluminescence phenomenon of organic compound, and the like.

In those display panels, the large number of LEDs and the large number of organic EL devices are used as light emission devices. Thus, a constant current driving apparatus can not be constituted only by one driving circuit (IC). Generally, the large number of light emission devices constituting the display panel are divided into a plurality of blocks, and the plurality of blocks are driven by a plurality of driving circuits, respectively.

In this case, when there is an irregular component in an output current outputted from the output terminal of each driving circuit, this irregularity causes a variation to be induced in a light emission amount of the light emission device. As a result, a display irregularity is generated in the display panel. Therefore, in order that the output current outputted from the output terminal of each driving circuit is made constant, the reference current is made constant by adjusting the resistive value of the reference current setting resistor R installed in each driving circuit.

As mentioned above, the conventional driving circuit employs the method of independently setting an input current of the current mirror circuit by adjusting the resistive value. Thus, when the plurality of driving circuits are used to drive the display panel at the constant current, it is difficult to reduce the variation in the reference currents of driving circuits.

In order to solve such problems, Japanese Laid Open Patent Application (JP-A 2000-293245) discloses "Constant Current Driving Apparatus And Constant Current Drive Semiconductor Integrated Circuit". In this constant current driving apparatus, a plurality of constant current driver ICs are used in order to drive an organic EL element of an EL display panel at a constant current.

A constant current driver circuit and a control circuit are contained in each of the constant current driver ICs. A reference current generating circuit is built in each of the constant current driver ICs. A reference output current generated on the basis of a reference resistor is outputted from a reference terminal. The reference output current outputted from the reference current generating circuit is inputted to a reference current input terminal of each constant current driver IC. The drive currents having the same current value are respectively outputted from the output terminals. The drive current is controlled so as to be turned on and off by each control circuit.

Due to this configuration, by using the plurality of the constant current driver ICs, a large number of loads can be driven at the small variation in the output current among the constant current driver ICs.

However, in the case of the driving circuit constituted by the current mirror circuit having the large number of output terminals, the impedance of the common power supply line of the current mirror circuit causes a current ratio to be deviated on the basis of the position of the output terminal. FIG. 2 shows the relation between the deviation in the current ratio and the wiring resistance value of the current mirror circuit.

As can be understood from FIG. 2, as the wiring resistance value of the current mirror circuit is increased, namely, as the position of a cell (transistor) is located farther from the power supply terminal, the deviation in the current ratio is made larger. As a result, a difference occurs between a brightness of a light emission device driven by a transistor located close to the power supply terminal and a brightness of a light emission device driven by a transistor located far from the power supply terminal.

Thus, as shown in FIG. 3A, when the four driving circuits drive the light emission devices of the display panel, the output current of each of the driving circuits is decreased as they are located farther from the power supply terminal, as indicated by solid lines of FIG. 3B. This results in the large difference between an output current from an output terminal on an end side of one driving circuit and an output current from an output terminal on a beginning side of a driving circuit adjacent thereto, as indicated by A of FIG.

3B. This results in the evident brightness difference in the boundary between the light emission device driven by the one driving circuit and the light emission device driven by the driving circuit adjacent thereto. Hence, the picture quality is extremely dropped.

Dashed lines in FIG. 3B indicate the variation in the output current, which variation is generated based on the variation in the electrical characteristic caused by the product process of the driving circuit. Although, this problem can be logically solved by suitably selecting the reference current by properly selecting the value of the reference current setting resistor R, actually, it is difficult to suppress the variation in the reference current to a small value, as mentioned above.

In order to solve the above-mentioned problems, namely, in order to reduce a slope of a property line of FIG. 2, it is necessary to reduce the impedance of the common power supply line. For this purpose, it is necessary to make the width of the common power supply line wider or install a plurality of power supply terminals. Also, in order to reduce the variation in the reference current of the current mirror circuit, it is necessary to carry out a trimming and the like or manage the semiconductor integrated circuit constituting the driving circuit at a wafer unit. They result in the factor of the cost increase when the driving circuit is constituted by the semiconductor integrated circuit.

SUMMARY OF THE INVENTION

Therefore, an object of the present invention is to provide a driving circuit, in which a variation in an output current between driving circuits adjacent to each other can be suppressed to be small and a cost is inexpensive, and a constant current driving apparatus using the same.

Means for achieving the object will be described below using reference numerals and symbols used in "Embodiments of the invention". These reference numerals and symbols are added so that relation between the description of "Scope of the Patent to be claimed" and the description of "Embodiments of the invention" is made clear. However, it is never permitted to use the reference numerals and symbols for the interpretation of technical scopes of the inventions described in "Scope of the Patent to be claimed" and the description of "Embodiments of the invention".

A driving circuit according to a first aspect of the present invention comprises a first current mirror circuit (10, 10*a*, 10*b*, 10*c*, 10*d*, 10*e*, 10*f*, 10*g*) and a second current mirror circuit (20, 20*a*, 20*b*, 20*c*, 20*d*, 20*e*). The first current mirror circuit (10, 10*a*, 10*b*, 10*c*, 10*d*, 10*e*, 10*f*, 10*g*) outputs a plurality of output currents, each of which corresponds to a reference current. The second current mirror circuit which converts a polarity of an output current outputted from a final stage of the first current mirror circuit and outputs the converted output current.

This driving circuit can be configured as a current discharging type. In this case, the first current mirror circuit (10, 10*a*, 10*b*, 10*c*, 10*d*, 10*e*, 10*f*, 10*g*) may be configured so as to comprise a reference current input terminal (12) to which the reference current is supplied, a power supply terminal (11) to which power is supplied, a first circuit ($Tr_0$) provided between the reference current input terminal (12) and the power supply terminal (11) to determine the plurality of output currents, a common power supply line (16) which extends from the power supply terminal (11), a plurality of output terminals ($O_1$ to $O_n$), a plurality of second circuits ($Tr_1$ to $Tr_n$) provided between the common power supply line and the plurality of output terminals ($O_1$ to $O_n$) to output one of the plurality of output currents determined by the first circuit ($Tr_0$) through the plurality of output terminals ($O_1$ to $O_n$) and a third circuit ($Tr_{n+1}$) provided at a next stage of the plurality of second circuits ($Tr_1$ to $Tr_n$) as the final stage of the first current mirror circuit (10, 10*a*, 10*b*, 10*c*, 10*d*, 10*e*, 10*f*, 10*g*) to output the output current determined by the first circuit ($Tr_0$). The second current mirror circuit (20, 20*a*, 20*b*, 20*c*, 20*d*, 20*e*) may be configured so as to convert the polarity of the output current outputted from the third circuit ($Tr_{n+1}$) and outputs the converted output current through a reference current output terminal (13).

Actually, this driving circuit may be configured such that the first circuit ($Tr_0$), the second circuits ($Tr_1$ to $Tr_n$) and the third circuit ($Tr_{n+1}$) included in the first current mirror circuit (10, 10*a*, 10*b*, 10*c*, 10*d*, 10*e*, 10*f*, 10*g*) are constituted by PNP transistors, and the second current mirror circuit (20, 20*a*, 20*b*, 20*c*, 20*d*, 20*e*) is constituted by NPN transistors. In this case, it may be configured such that at least one of the first circuit ($Tr_0$) and the second current mirror circuit (20, 20*a*, 20*b*, 20*c*, 20*d*, 20*e*) has a base current compensating circuit ($Tr_x$ and/or $Tr_y$).

This driving circuit may be configured such that the first circuit ($Tr_0$), the second circuits ($Tr_1$ to $Tr_n$) and the third circuit ($Tr_{n+1}$) included in the first current mirror circuit (10, 10*a*, 10*b*, 10*c*, 10*d*, 10*e*, 10*f*, 10*g*) are constituted by P-channel MOS transistors, and the second current mirror circuit (20, 20*a*, 20*b*, 20*c*, 20*d*, 20*e*) is constituted by N-channel MOS transistors.

The power supply terminal (11) of the driving circuit of the current discharging type as mentioned above can be configured so as to be pulled out from a center of the common power supply line (16). Also, the power supply terminal can be configured so as to pulled out from a plurality of positions of the common power supply line (16).

Also, the driving circuit of the present invention can be configured as a current sucking type. In this case, the first current mirror circuit (10, 10*a*, 10*b*, 10*c*, 10*d*, 10*e*, 10*f*, 10*g*) comprises a reference current input terminal (12) to which the reference current is supplied, a ground terminal (14) which is connected to a ground, a first circuit ($Tr_0$) provided between the reference current input terminal (12) and the ground terminal (14) to determine the plurality of output currents, a common ground line (14) which extends from the ground terminal (14), a plurality of output terminals ($O_1$ to $O_n$), a plurality of second circuits ($Tr_1$ to $Tr_n$) provided between the common ground line (17) and the plurality of output terminals ($O_1$ to $O_n$) to output one of the plurality of output currents determined by the first circuit ($Tr_0$) through the plurality of output terminals ($O_1$ to $O_n$) and a third circuit ($Tr_{n+1}$) provided at a next stage of the plurality of second circuits ($Tr_1$ to $Tr_n$) as the final stage of the first current mirror circuit (20, 20*a*, 20*b*, 20*c*, 20*d*, 20*e*) to output the output current determined by the first circuit. The second current mirror circuit (20, 20*a*, 20*b*, 20*c*, 20*d*, 20*e*) can be configured so as to convert the polarity of the output current outputted from the third circuit ($Tr_{n+1}$) and outputs the converted output current through a reference current output terminal (13).

Actually, this driving circuit can be configured such that the first circuit ($Tr_0$), the second circuits ($Tr_1$ to $Tr_n$) and the third circuit ($Tr_{n+1}$) included in the first current mirror circuit (10, 10*a*, 10*b*, 10*c*, 10*d*, 10*e*, 10*f*, 10*g*) are constituted by NPN transistors, and the second current mirror circuit (20, 20*a*, 20*b*, 20*c*, 20*d*, 20*e*) is constituted by PNP transistors. In this case, it may be configured such that at least one of the first circuit ($Tr_0$) and the second current mirror circuit (20,

20*a*, 20*b*, 20*c*, 20*d*, 20*e*) has a base current compensating circuit ($Tr_x$ and/or $Tr_y$).

This driving circuit may be configured such that the first circuit ($Tr_0$), the second circuits ($Tr_1$ to $Tr_n$) and the third circuit ($Tr_{n+1}$) included in the first current mirror circuit (10, 10*a*, 10*b*, 10*c*, 10*d*, 10*e*, 10*f*, 10*g*) are constituted by N-channel MOS transistors, and the second current mirror circuit (20, 20*a*, 20*b*, 20*c*, 20*d*, 20*e*) is constituted by P-channel MOS transistors.

The ground terminal (14) of the driving circuit of the current sucking type as mentioned above can be configured so as to be pulled out from a center of the common ground line (17). Also, the ground terminal (14) can be configured so as to be pulled out from a plurality of positions of the common ground line (17).

A constant current driving apparatus according to a second aspect of the present invention is composed of a plurality of driving circuits ($\mathbf{1}_1$ to $\mathbf{1}_N$) connected through terminals (12 and 13) in series, each of which comprises a first current mirror circuit (10, 10*a*, 10*b*, 10*c*, 10*d*, 10*e*, 10*f*, 10*g*) which outputs a plurality of output currents each of which corresponds to a reference current and a second current mirror circuit (20, 20*a*, 20*b*, 20*c*, 20*d*, 20*e*) which converts a polarity of an output current outputted from a final stage of the first current mirror circuit (10, 10*a*, 10*b*, 10*c*, 10*d*, 10*e*, 10*f*, 10*g*) and outputs the converted output current.

BRIEF DESCRIPTION OF THE DRAWINGS

FIG. 14 is a circuit diagram showing a configuration of a driving circuit according to a fifth embodiment of the present invention;

FIG. 15 is a circuit diagram showing a configuration of a driving circuit according to a sixth embodiment of the present invention;

DESCRIPTION OF THE PREFERRED EMBODIMENTS

A driving circuit and a constant current driving apparatus according to embodiments of the present invention will be described below with reference to the attached drawings.

(First Embodiment)

A driving circuit according to a first embodiment of the present invention is designed such that a current mirror circuit of a current discharging type, which discharges a current from an output terminal, is constituted by bipolar transistors.

Figure 1:
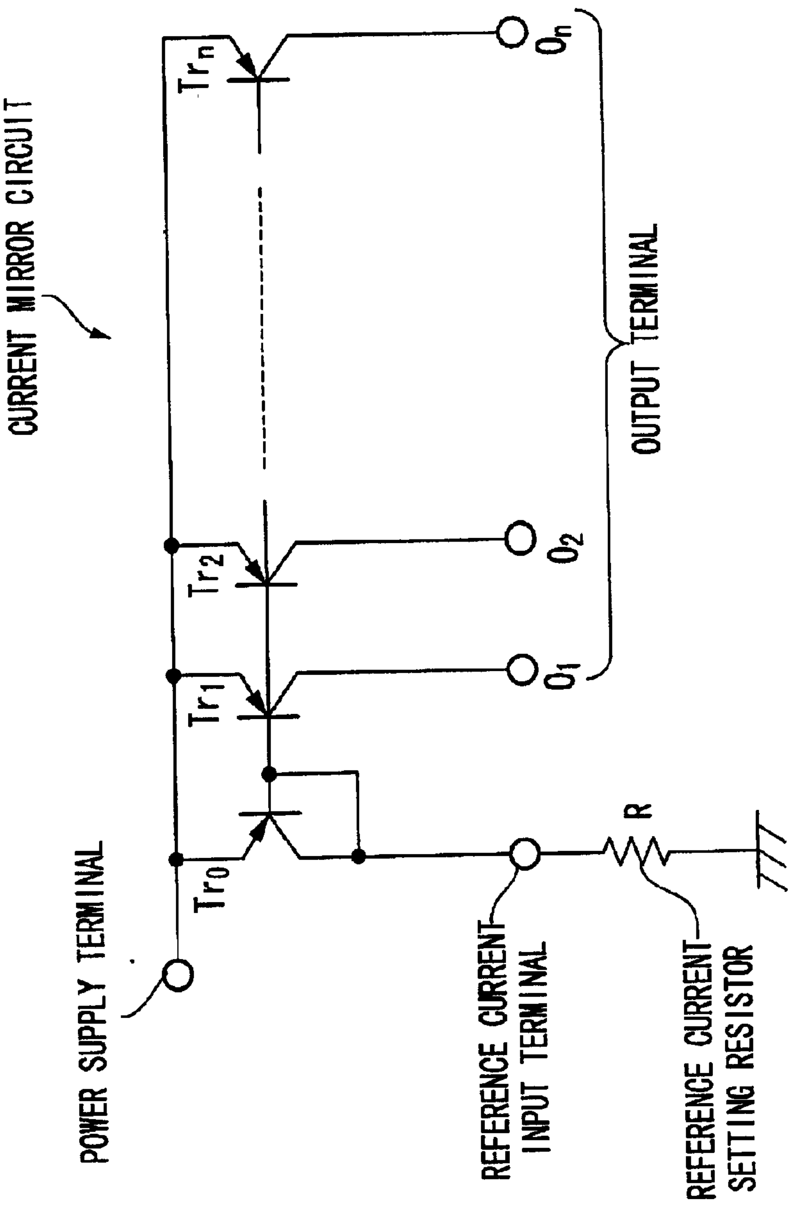
Fig. 1 PRIOR ART
FIG. 1 is a circuit diagram showing a configuration of a conventional driving circuit using a current mirror circuit.
Figure 2:
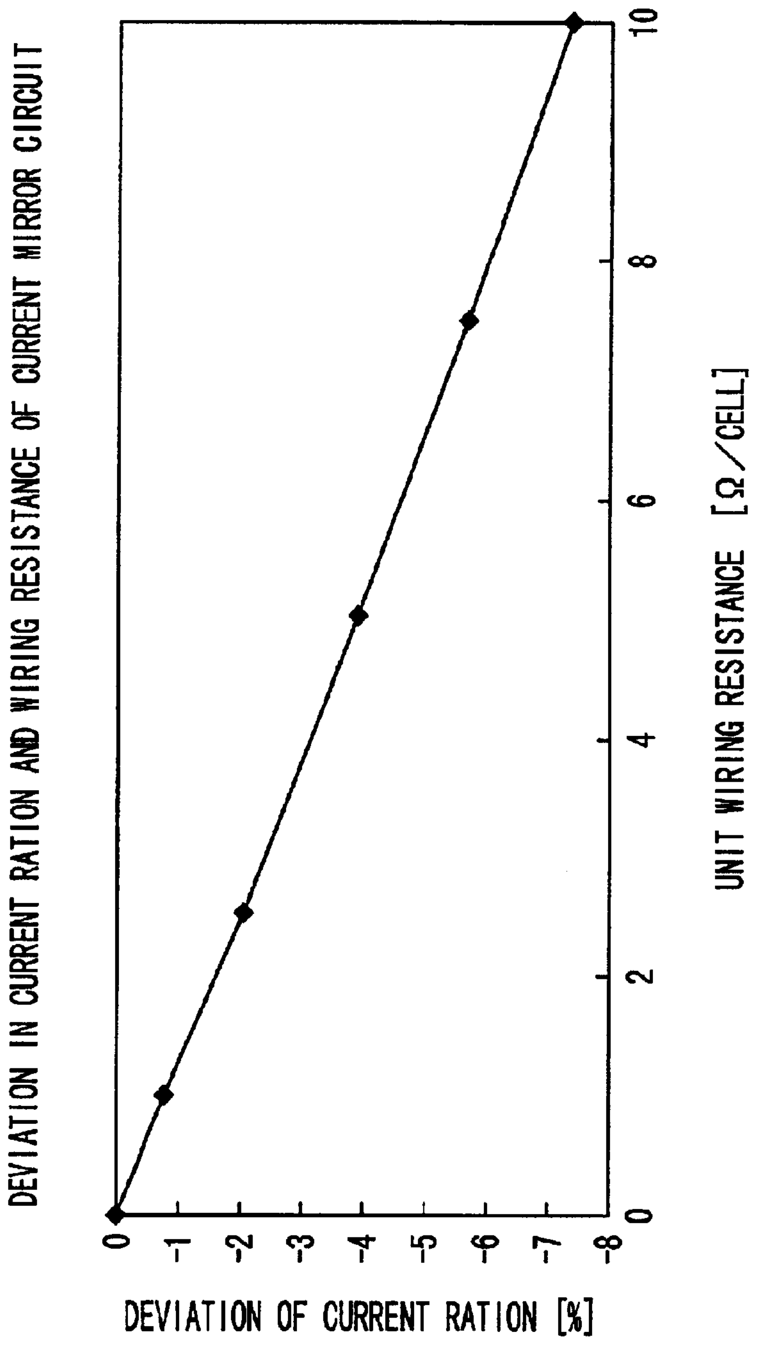
Fig. 2 PRIOR ART
FIG. 2 is an explanatory diagram describing an operation of the driving circuit shown in FIG. 1.
Figure 3A:
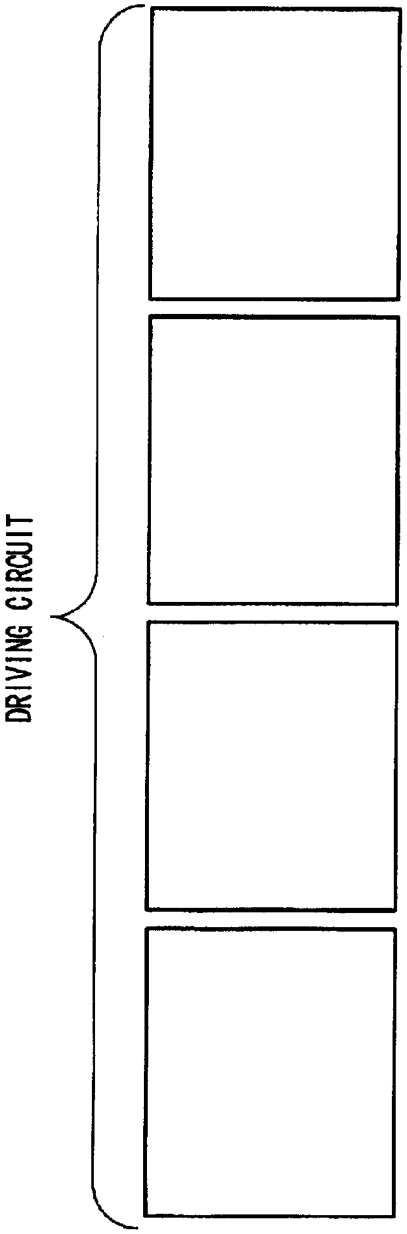
Fig. 3A PRIOR ART
FIGS. 3A and 3B are explanatory diagrams describing an operation of a constant current driving apparatus using the driving circuit shown in FIG. 1.
Figure 3B:
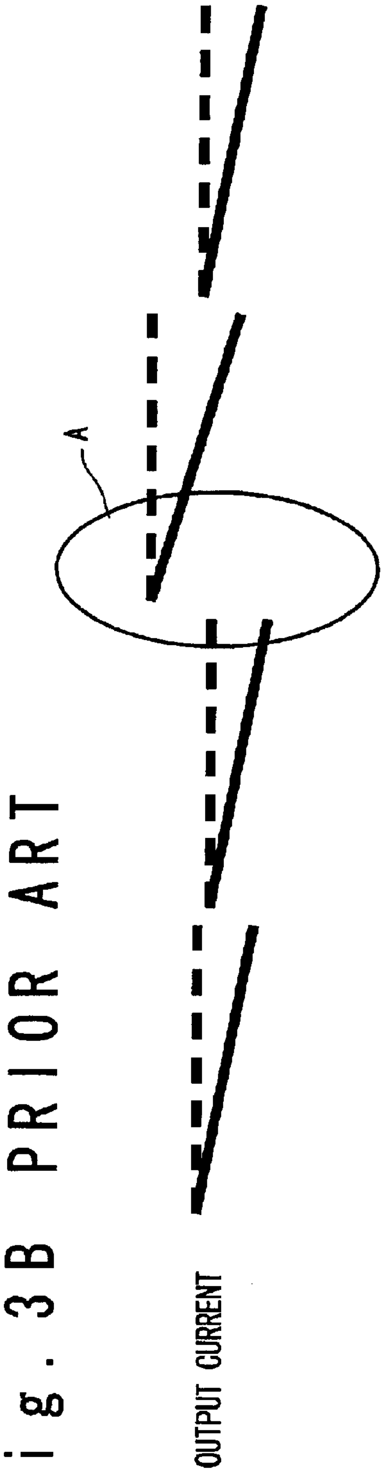
Fig. 3B PRIOR ART
Figure 4:
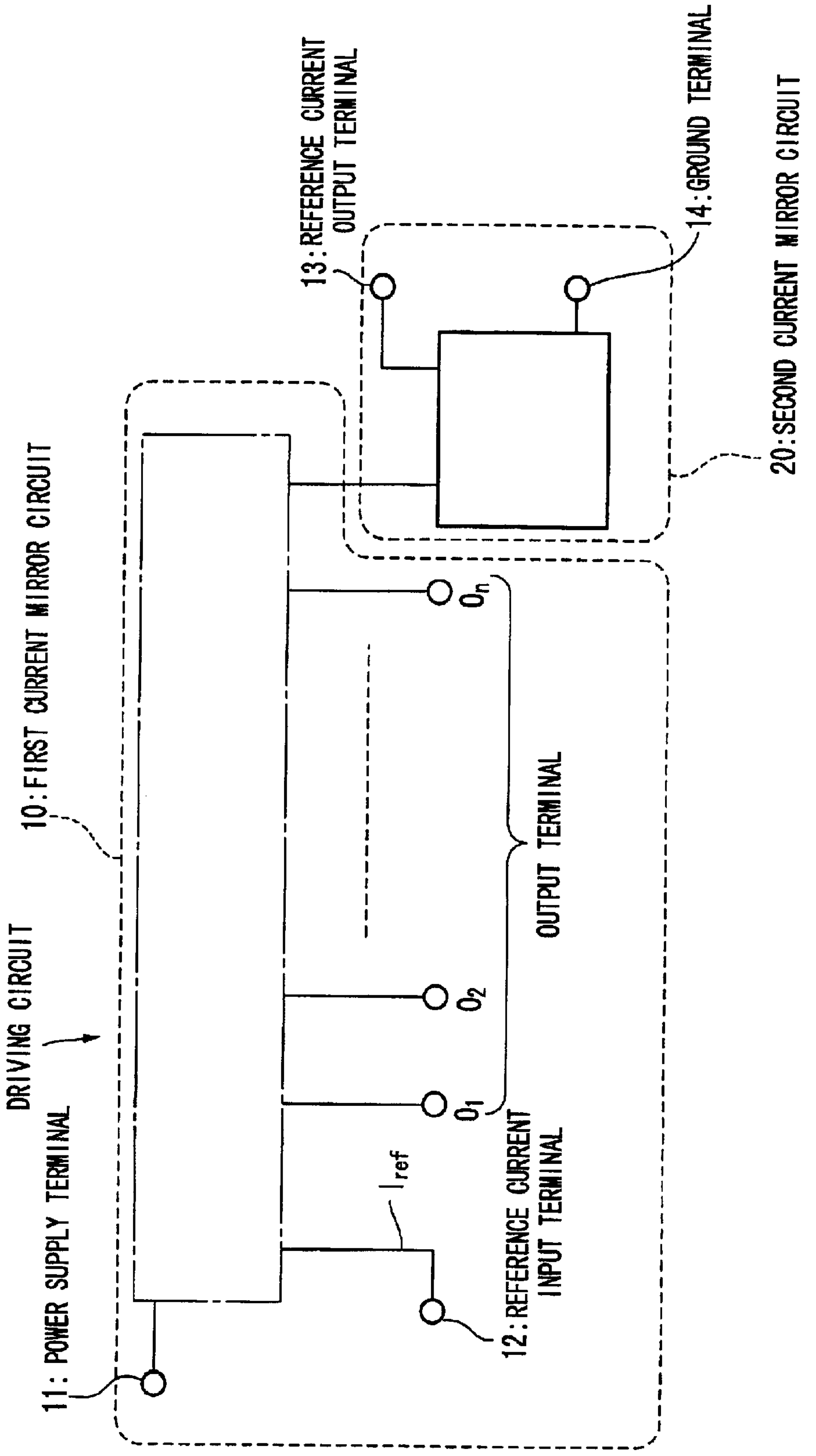
FIG. 4 is a block diagram showing a configuration of a driving circuit according to a first embodiment of the present invention.

FIG. 4 is a block diagram showing a configuration of a driving circuit according to the first embodiment of the present invention. This driving circuit is composed of a first current mirror circuit 10 and a second current mirror circuit 20.

The first current mirror circuit 10 has a power supply terminal 11, a reference current input terminal 12 and output terminals $O_1$ to $O_n$ ("n" is an integer equal to or greater than 2). This first current mirror circuit 10 outputs output currents corresponding to an input current $I_{ref}$ which is supplied to the reference current input terminal 12, from the output terminals $O_1$ to $O_n$. Also, one of the output currents from the first current mirror circuit 10 is supplied to the second current mirror circuit 20.

The second current mirror circuit 20 converts a polarity of the output current from the first current mirror circuit 10, and then outputs it from a reference current output terminal 13. A ground terminal 14 is equipped in the second current mirror circuit 20.

Figure 5:
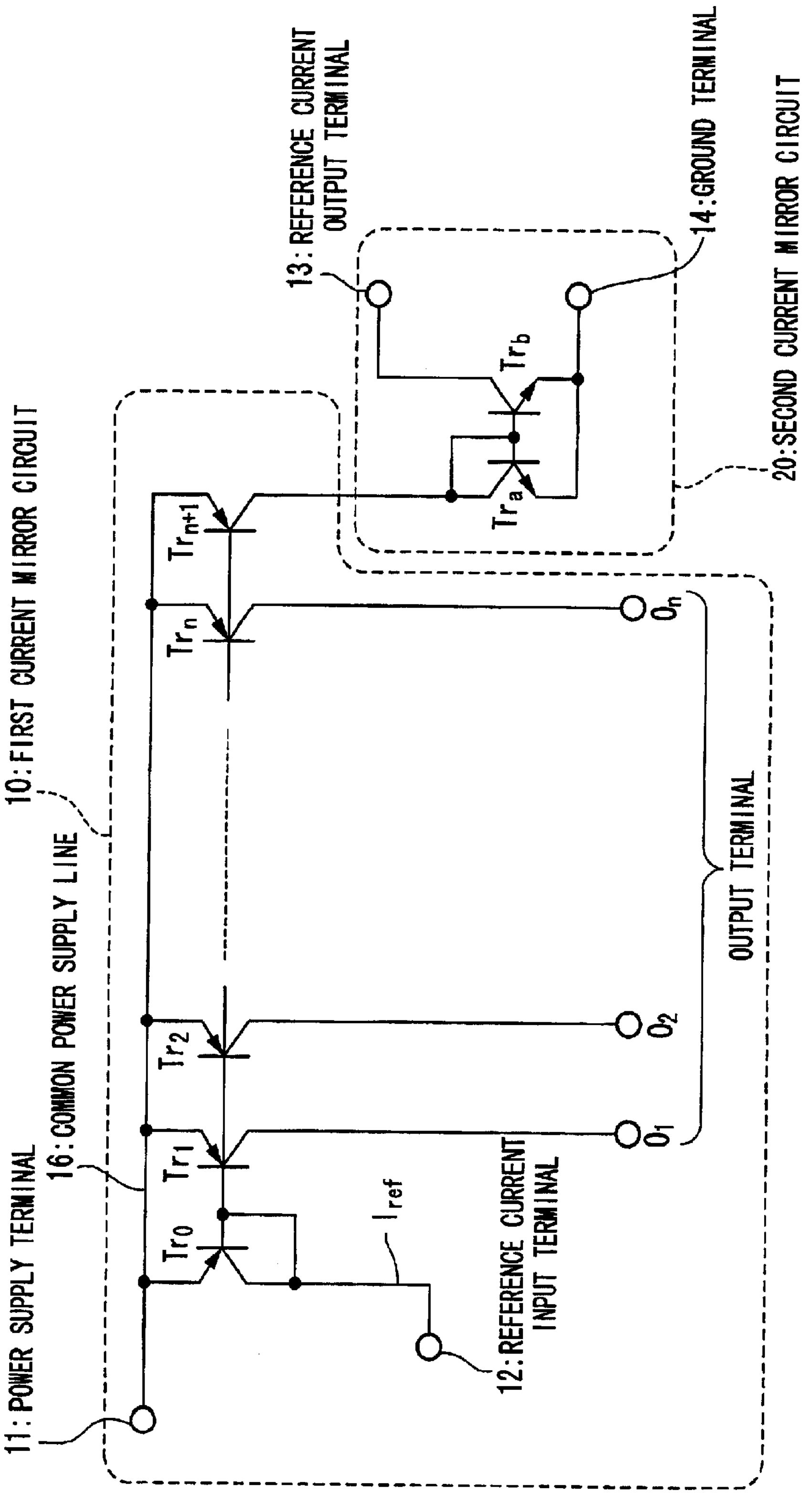
FIG. 5 is a circuit diagram showing the configuration of the driving circuit according to the first embodiment of the present invention.

FIG. 5 is a circuit diagram showing the detailed circuit configuration of the above-mentioned driving circuit. The first current mirror circuit 10 is composed of a plurality of PNP transistors $Tr_0$ to $Tr_{n+1}$. The PNP transistor $Tr_0$ corresponds to a first circuit of the present invention, the plurality of PNP transistors $Tr_1$ to $Tr_n$ correspond to a plurality of second circuits of the present invention, and the PNP transistor $Tr_{n+1}$ corresponds to a third circuit of the present invention.

In this first current mirror circuit 10, the power supply terminal 11 and the PNP transistors $Tr_0$ to $Tr_{n+1}$ are physically arranged at positions shown in FIG. 5. In short, the PNP transistor $Tr_0$ is physically arranged at the closest position to the power supply terminal 11, and the PNP transistor $Tr_{n+1}$ is physically arranged at the farthest position from the power supply terminal 11.

Respective bases of the plurality of PNP transistors $Tr_0$ to $Tr_{n+1}$ are connected to each other. Emitters are commonly connected to each other through a common power supply line 16, which is extendedly located from the power supply terminal 11. The base of the PNP transistor $Tr_0$ arranged at a first stage of the first current mirror circuit 10 is connected to a collector thereof. Accordingly, the so-called diode coupling is established.

A collector of the PNP transistor $Tr_{n+1}$ arranged at a final stage is connected to the second current mirror circuit 20. Collectors of the PNP transistors $Tr_1$ to $Tr_n$ arranged at middle stages are connected to the output terminals $O_1$ to $O_n$, respectively.

The second current mirror circuit 20 is composed of an NPN transistor $Tr_a$ and an NPN transistor $Tr_b$. A base of the NPN transistor $Tr_a$ is connected to a collector thereof so that the so-called diode coupling is established. An emitter of the NPN transistor $Tr_a$ is connected to the ground terminal 14. Also, a base of the NPN transistor $Tr_b$ is connected to the base of the NPN transistor $Tr_a$, a collector is connected to the reference current output terminal 13, and an emitter is connected to the ground terminal 14.

A current substantially equal to that flowing through the NPN transistor $Tr_a$ flows through this NPN transistor $Tr_b$. In this case, a direction of the current flowing through the NPN transistor $Tr_b$ is equal to that of the current flowing through the NPN transistor $Tr_a$. Thus, since the NPN transistor $Tr_b$ functions so as to suck the current, the polarity of the current outputted from the PNP transistor $Tr_{n+1}$ is converted such that the polarity is inverted.

An example of a constant current driving apparatus constituted by connecting N ("N" is an integer equal to or greater than 2) driving circuits having the above-mentioned configuration will be described below.

Figure 6A:
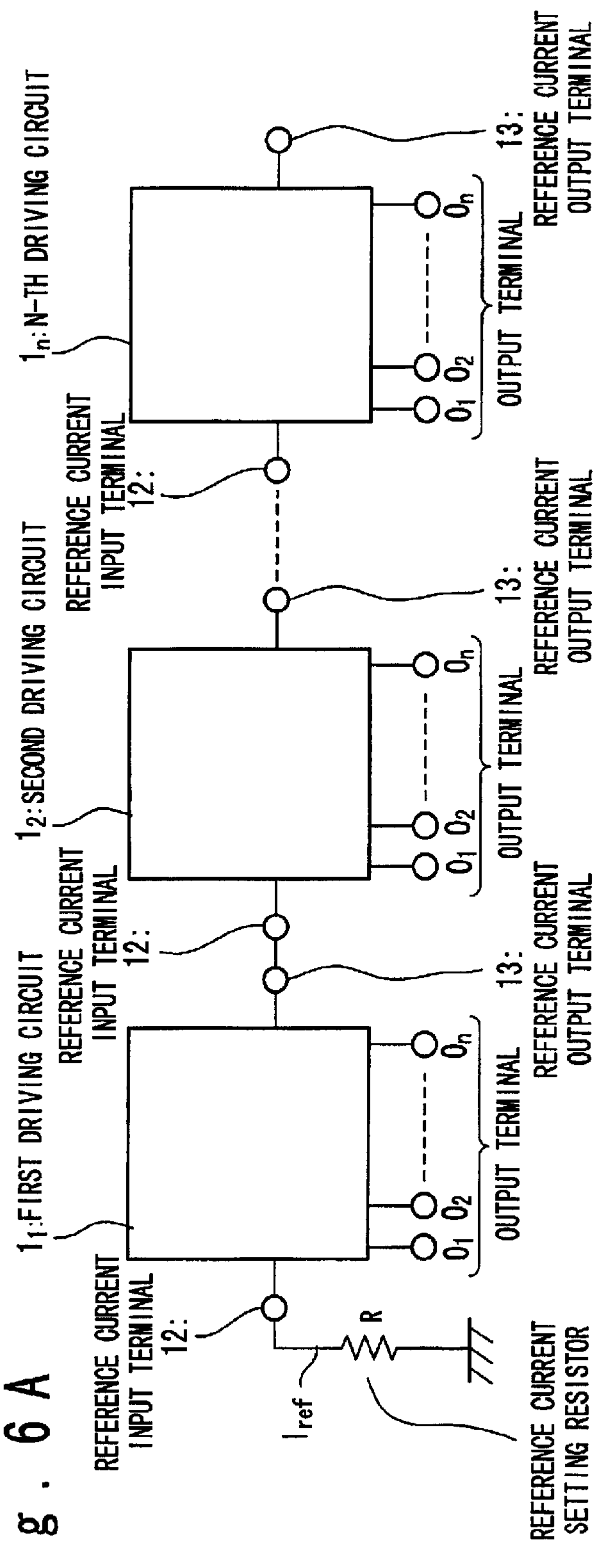
FIG. 6A is a block diagram showing a configuration of a constant current driving apparatus using the driving circuit according to the first embodiment of the present invention.

FIG. 6A is a block diagram showing the configuration of the constant current driving apparatus in which the N driving circuits are connected in serial. A reference current input terminal 12 of a first driving circuit $\mathbf{1}_1$ arranged at a first stage is connected through a reference current setting resistor R to the ground. This reference current setting resistor R determines a reference current $I_{ref}$ flowing through the collector of the PNP transistor $Tr_0$ included in the first current mirror circuit 10 of the first driving circuit $\mathbf{1}_1$. Thus, the suitable selection of the value of the reference current setting resistor R enables an output current having a desired value to be obtained from the output terminals $O_1$ to $O_n$ of the first driving circuit $\mathbf{1}_1$.

A reference current output terminal 13 of the first driving circuit $\mathbf{1}_1$ is connected to a reference current input terminal 12 of a second driving circuit $\mathbf{1}_2$ arranged at a next stage. In the same manner, the respective driving circuits are connected in series. A reference current output terminal 13 of an N-th driving circuit $\mathbf{1}_N$ arranged at a final stage is not connected.

In the constant current driving apparatus having the above-mentioned configuration, a value of the current discharged from the output terminal $O_n$ of the first driving circuit $\mathbf{1}_1$ is substantially equal to that of a current sucked from the reference current output terminal 13 of the first driving circuit $\mathbf{1}_1$, and a value of the current discharged from the reference current input terminal 12 of the second driving circuit $\mathbf{1}_2$ is substantially equal to that of a current discharged from the output terminal $O_1$ of the second driving circuit $\mathbf{1}_2$. Thus, a value of an output current discharged from the output terminal on of the first driving circuit $\mathbf{1}_1$ is substantially equal to that of an output current discharged from the output terminal $O_1$ of the second driving circuit $\mathbf{1}_2$.

Figure 6B:
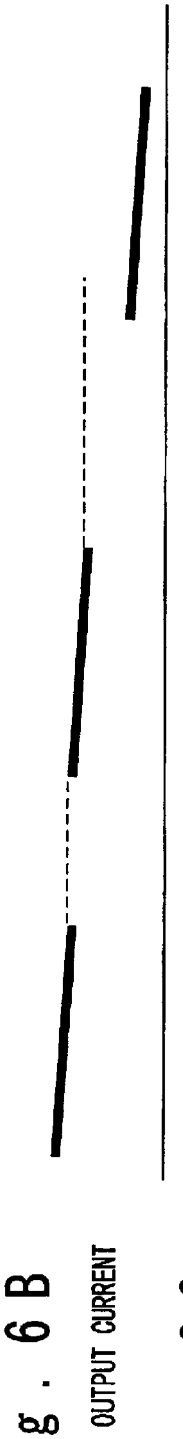
FIG. 6B is explanatory diagrams describing an operation of a constant current driving apparatus using the driving circuit according to the first embodiment of the present invention.

As a result, the values of the output currents in the boundary between the first driving circuit $\mathbf{1}_1$ and the second driving circuit $\mathbf{1}_2$ are substantially equal to each other, as shown in FIG. 6B. This equality is similar in the other driving circuits. That is, the values of the output currents in the boundary between the driving circuits adjacent to each other are substantially equal to each other. Thus, if this constant current driving apparatus is applied to a display panel, there is not a substantial brightness difference in a boundary between a light emission device driven by one driving circuit and another light emission device driven by a driving circuit adjacent thereto. Hence, it is possible to attain the picture having high quality.

(Second Embodiment)

A driving circuit according to a second embodiment of the present invention is designed such that a base current compensating circuit is added to each of the first and second current mirror circuits in the driving circuit according to the first embodiment.

Figure 7:
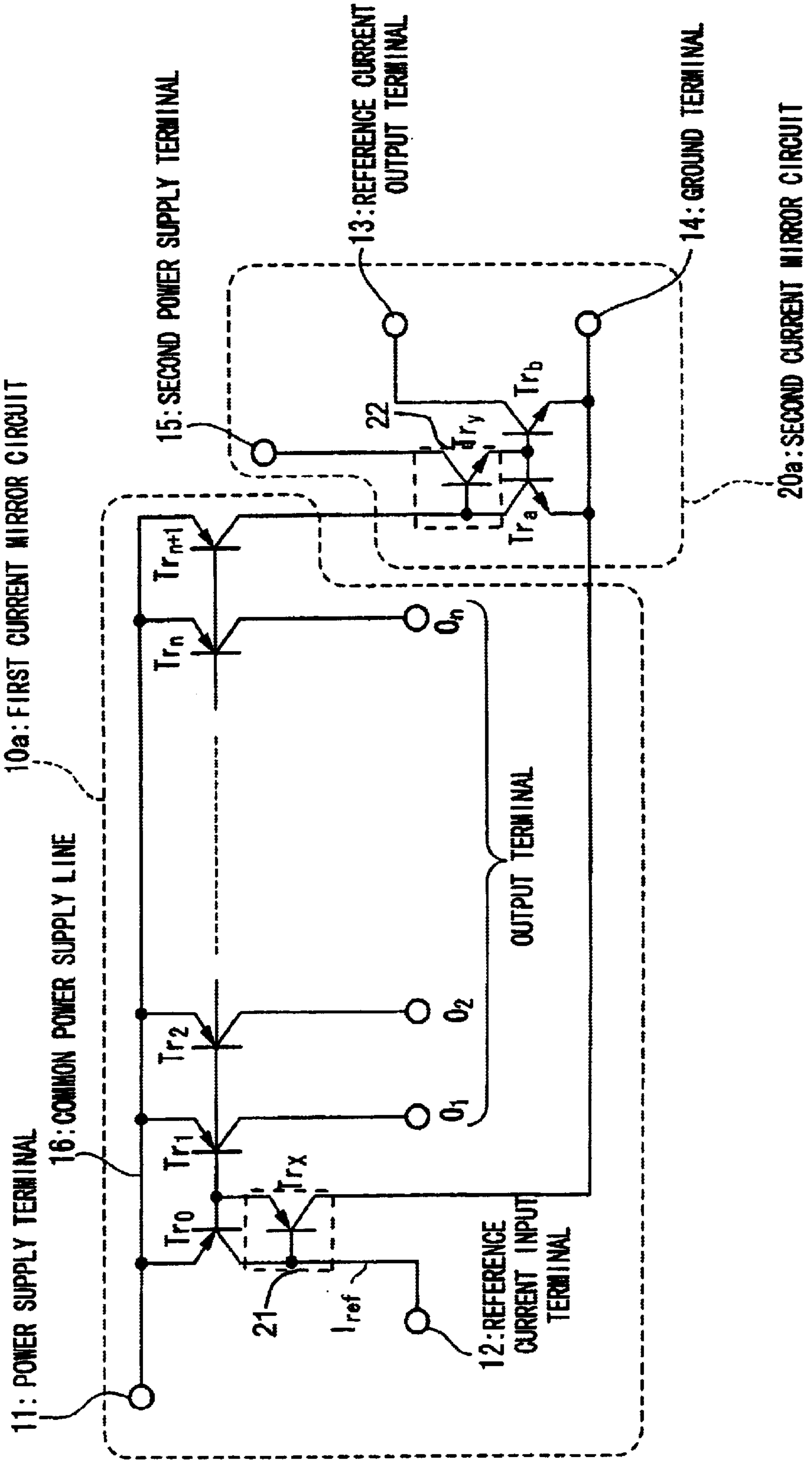
FIG. 7 is a circuit diagram showing a configuration of a driving circuit according to a second embodiment of the present invention.

FIG. 7 is a circuit diagram showing the configuration of the driving circuit according to the second embodiment. In this driving circuit, a first current mirror circuit 10*a* is configured such that a PNP transistor $Tr_x$ serving as the base current compensating circuit 21 is added to the first current mirror circuit 10 of the driving circuit according to the first embodiment.

A base of the PNP transistor $Tr_x$ 21 is connected to the collector of the PNP transistor $Tr_o$, an emitter is connected to the base of the PNP transistor $Tr_o$, and a collector is connected to a ground terminal 14.

In the aforementioned driving circuit according to the first embodiment, a base current of a transistor whose current amplification factor $h_{fe}$ is large is sufficiently smaller than collector current. Thus, an equation "reference current $I_{ref}$= collector current $I_c$" can be defined by ignoring the base current. However, if the base current can not be ignored, the collector current $I_c$ can be made closer to the reference current $I_{ref}$ by adding the base current compensating circuit constituted by the transistor $Tr_x$.

Also, a second current mirror is 20*a* is configured such that an NPN transistor $Tr_y$ serving as a base current compensating circuit 22 is added to the second current mirror circuit 20 of the driving circuit according to the first embodiment.

A base of the NPN transistor $Tr_y$ 22 is connected to the collector of an NPN transistor $Tr_a$, an emitter is connected to the base of the NPN transistor $Tr_a$, and a collector is connected to a second power supply terminal 15. A power supply suitable for compensating the base current of the NPN transistor $Tr_a$ is impressed to the second power supply terminal 15.

The addition of the base current compensating circuit constituted by the NPN transistor $Tr_y$, 22 enables a collector current $I_c$ of the NPN transistor $Tr_a$ to be closer to the reference current $I_{ref}$ even if the base current can not be ignored.

As mentioned above, according to the driving circuit of the second embodiment of the present invention, the current flowing through the reference current input terminal 12 can be made coincident with the output current outputted from the output terminals $O_1$ to $O_n$ with the high accuracy. Also, the current flowing through the collector of the PNP transistor $Tr_{n+1}$ arranged at the final stage of the first current mirror circuit 10*a* can be made coincident with the current flowing through the reference current output terminal 13 with the high accuracy. Thus, it is possible to carry out the precise current control.

Figure 8:
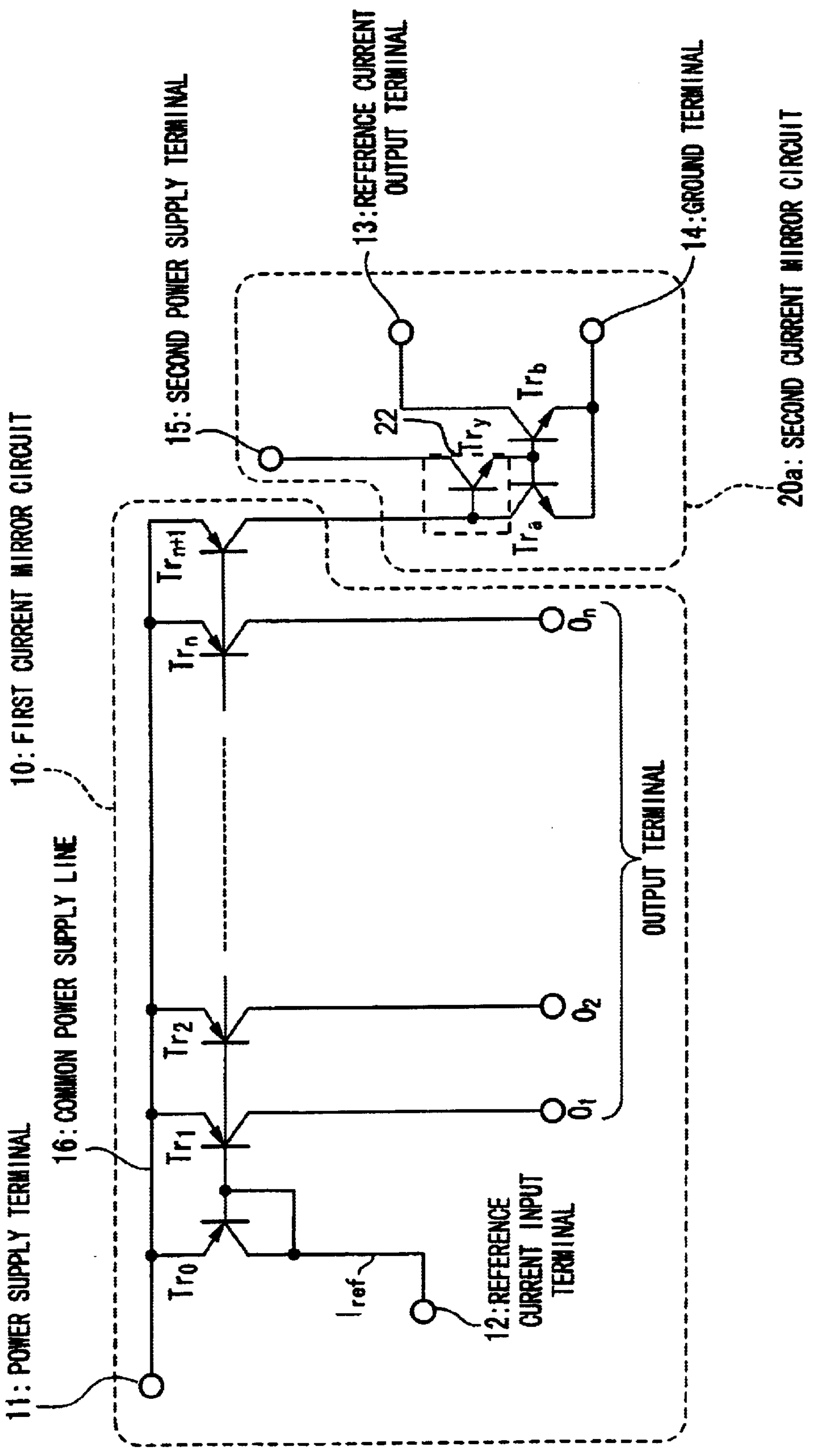
FIG. 8 is a circuit diagram showing a first variation of the driving circuit according to the second embodiment of the present invention.
Figure 9:
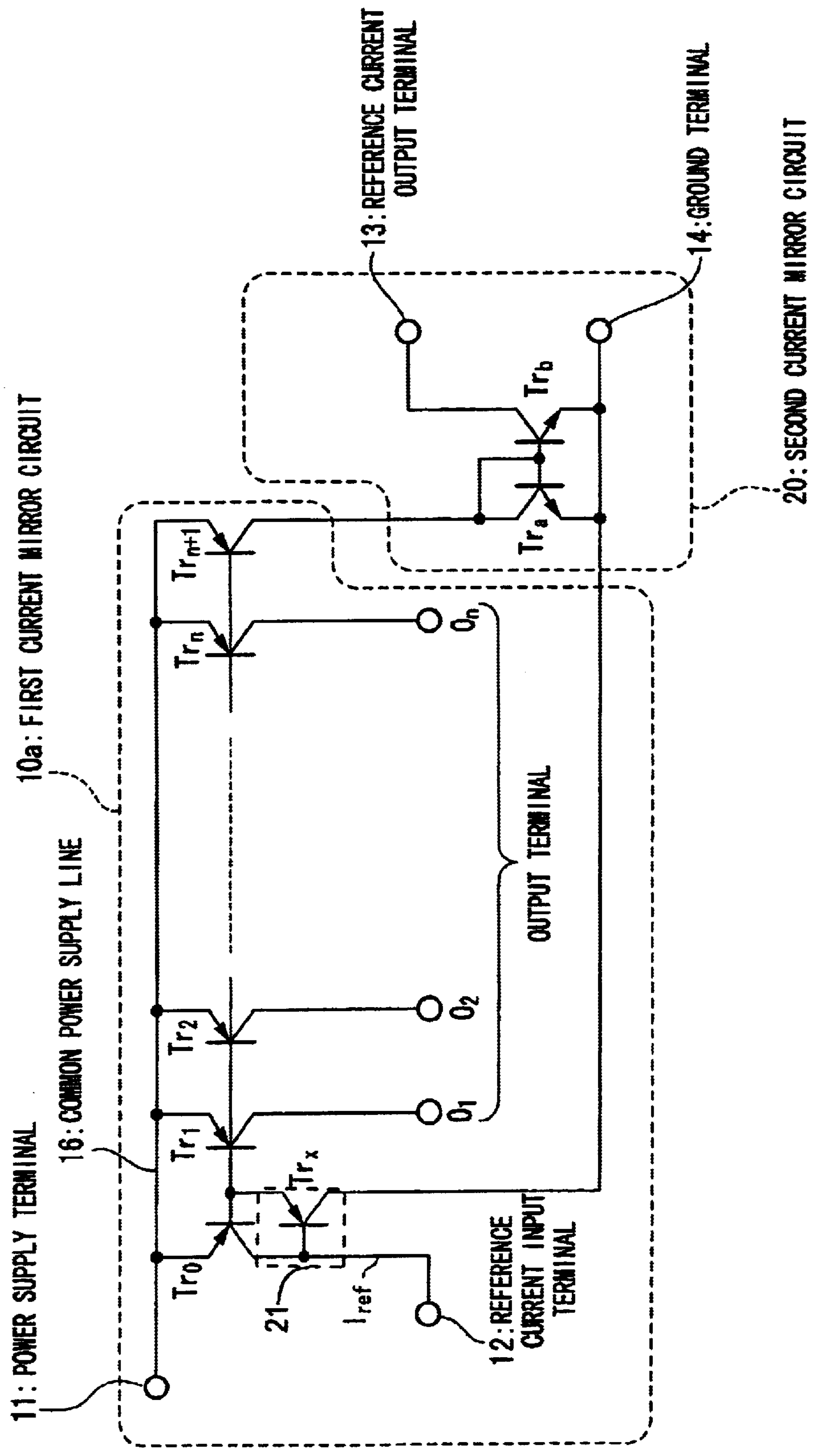
FIG. 9 is a circuit diagram showing a second variation of the driving circuit according to the second embodiment of the present invention.

It should be noted that the second embodiment is designed such that the base current compensating circuit is installed in each of the first current mirror circuit 10*a* and the second current mirror circuit 20*a*. However, as shown in FIG. 8, the base current compensating circuit 22 may be installed only in the second current mirror circuit 20*a*. Also, as shown in FIG. 9, the base current compensating circuit 21 may be installed only in the first current mirror circuit 10*a*.

(Third Embodiment)

A driving circuit according to a third embodiment of the present invention is designed such that a current mirror circuit of a current sucking type, which sucks a current from an output terminal, is constituted by bipolar transistors. It should be noted that this embodiment will be described below by giving the symbols similar to those of the first embodiment to the portions corresponding to the first embodiment.

Figure 10:
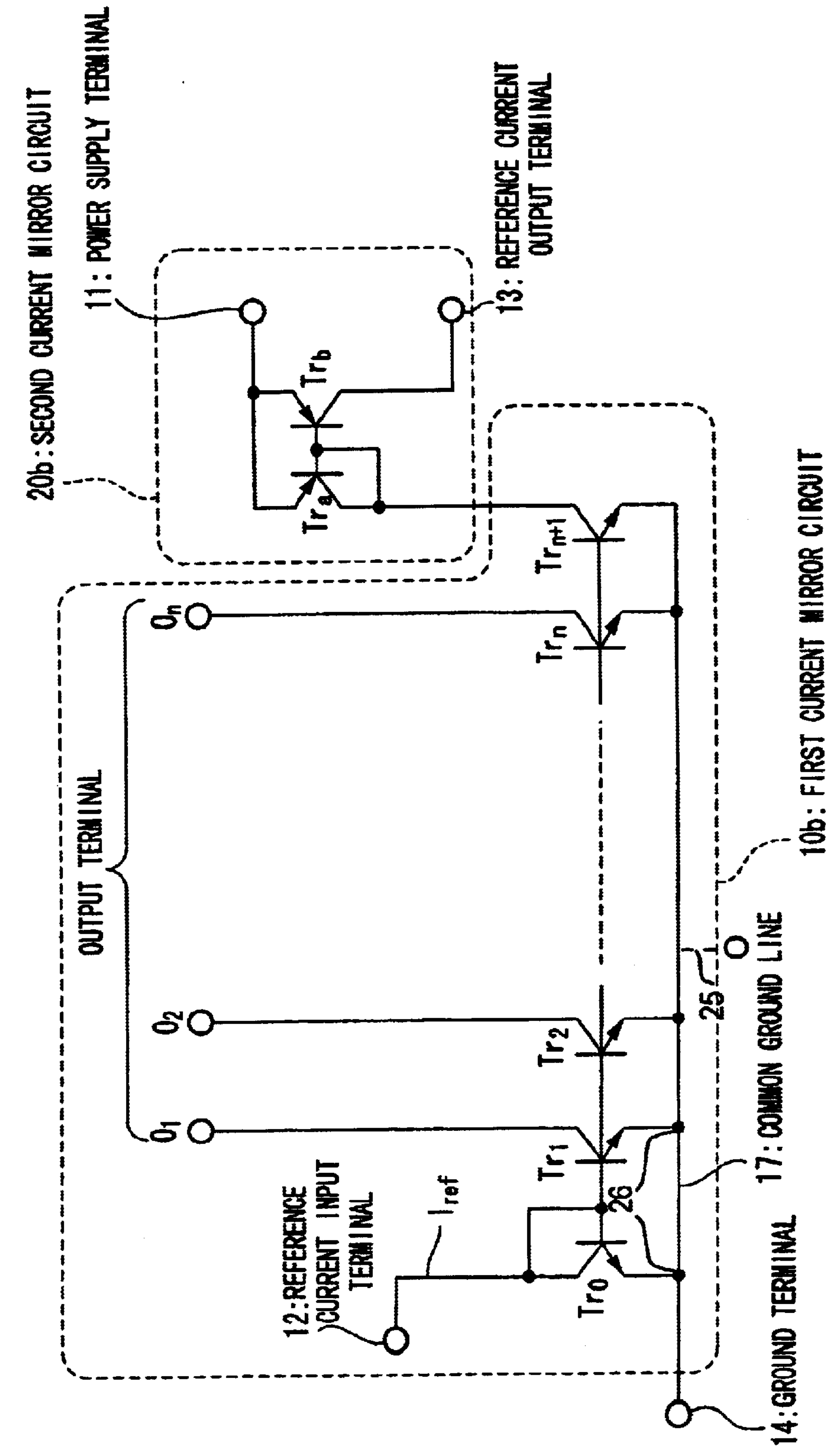
FIG. 10 is a circuit diagram showing a configuration of a driving circuit according to a third embodiment of the present invention.

FIG. 10 is a circuit diagram showing a detailed circuit configuration of a driving circuit according to the third embodiment of the present invention. This driving circuit is composed of a first current mirror circuit 10*b* and a second current mirror circuit 20*b*.

The first current mirror circuit 10*b* is composed of a plurality of NPN transistors $Tr_0$ to $Tr_{n+1}$. The NPN transistor $Tr_0$ corresponds to a first circuit of the present invention, a plurality of NPN transistors $Tr_1$ to $Tr_n$ correspond to a plurality of second circuits of the present invention, and an NPN transistor $Tr_{n+1}$ corresponds to a third circuit of the present invention.

In this first current mirror circuit 10*b*, the ground terminal 14 and the NPN transistors $Tr_0$ to $Tr_{n+1}$ are physically arranged at positions shown in FIG. 10. In short, the NPN transistor $Tr_0$ is physically arranged at the closest position to the ground terminal 14, and the NPN transistor $Tr_{n+1}$ is physically arranged at the farthest position from the ground terminal 14.

Respective bases of the plurality of NPN transistors $Tr_0$ to $Tr_{n+1}$ are connected to each other. Emitters are commonly connected to each other through a common ground line 17 extendedly located from the ground terminal 14. The base of the NPN transistor $Tr_0$ arranged at a first stage of the first current mirror circuit 10*b* is connected to a collector thereof. Accordingly, the so-called diode coupling is established.

A collector of the transistor $Tr_{n+1}$ arranged at a final stage is connected to the second current mirror circuit 20*b*. Collectors of the NPN transistors $Tr_0$ to $Tr_n$ arranged at the middle stages are connected to the output terminals $O_1$ to $O_n$, respectively.

The second current mirror circuit 20*b* is composed of a PNP transistor $Tr_a$ and a PNP transistor $Tr_b$. A base of the PNP transistor $Tr_a$ is connected to a collector thereof so that the so-called diode coupling is established. An emitter of the PNP transistor $Tr_a$ is connected to the power supply terminal 11. Also, a base of the PNP transistor $Tr_b$ is connected to the base of the PNP transistor $Tr_a$, a collector thereof is connected to the reference current output terminal 13, and an emitter thereof is connected to the power supply terminal 11.

A current substantially equal to that flowing through the PNP transistor $Tr_a$ flows through this PNP transistor $Tr_b$. In this case, a direction of the current flowing through the PNP transistor $Tr_b$ is equal to that of the current flowing through the PNP transistor $Tr_a$. Thus, since the PNP transistor $Tr_b$ functions so as to discharge the current, the polarity of the current outputted from the NPN transistor $Tr_{n+1}$ is converted such that the polarity is inverted.

The operation of the driving circuit having the above-mentioned configuration is equal to that of the driving circuit according to the first embodiment except that the PNP transistors and the NPN transistors are exchanged.

According to the driving circuit of the third embodiment of the present invention, it is possible to drive the light emission device having the current discharging type. Also, similarly to the first embodiment, if a constant current driving apparatus configured by using the plurality of driving circuits is applied to the display panel, there is not a substantial brightness difference in a boundary between a light emission device driven by one driving circuit and a light emission device driven by another driving circuit adjacent thereto. Hence, it is possible to attain the picture having high quality.

(Fourth Embodiment)

A driving circuit according to a fourth embodiment of the present invention is designed such that a base current compensating circuit is installed in each of the first and second current mirror circuits in the driving circuit according to the third embodiment.

Figure 11:
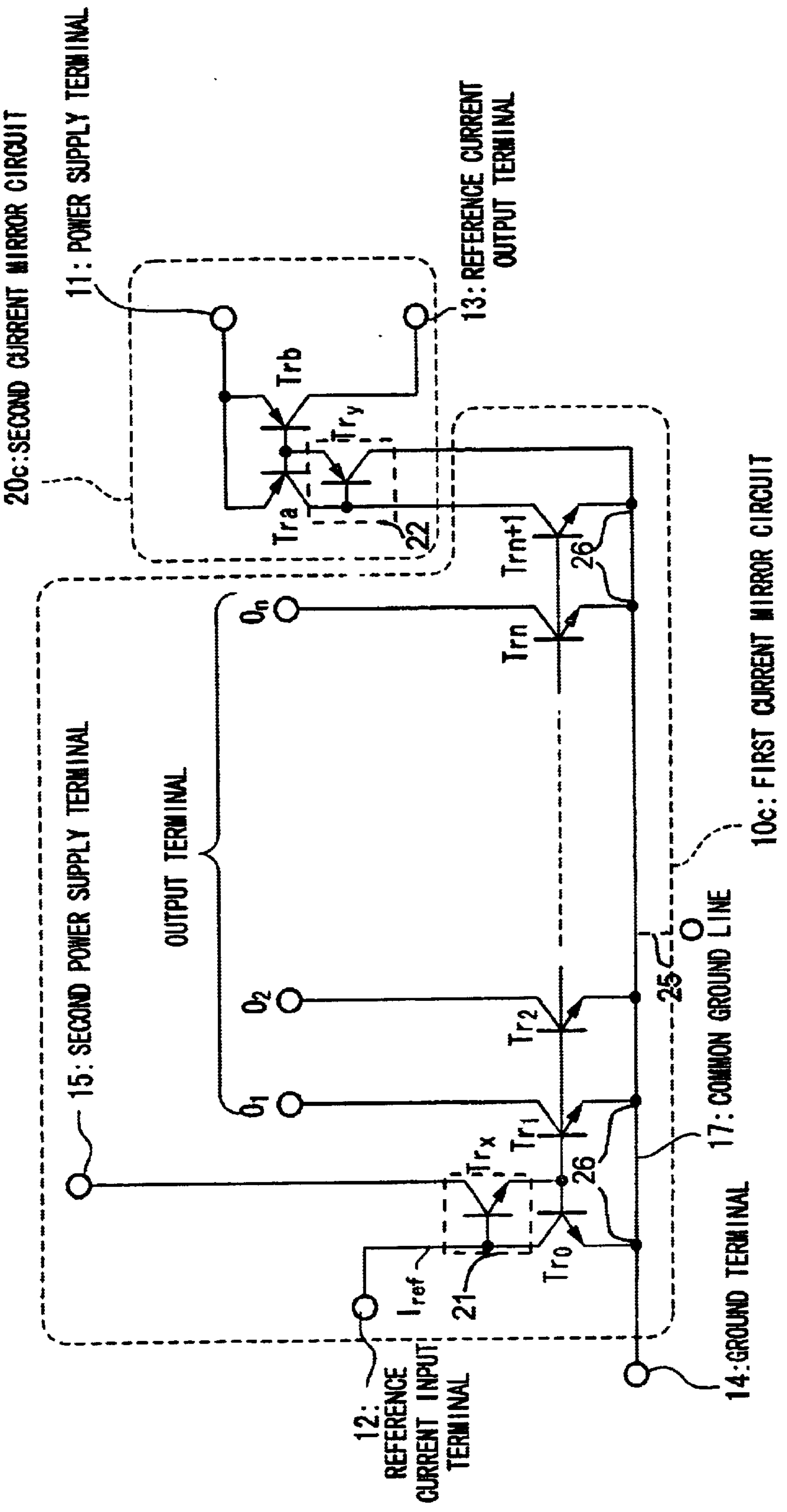
FIG. 11 is a circuit diagram showing a configuration of a driving circuit according to a fourth embodiment of the present invention.

FIG. 11 is a circuit diagram showing the configuration of the driving circuit according to the fourth embodiment. In this driving circuit, a first current mirror circuit 10*c* is configured such that an NPN transistor $Tr_x$ serving as the base current compensating circuit is added to the first current mirror circuit 10*b* of the driving circuit according to the third embodiment.

A base of the NPN transistor $Tr_x$ is connected to a collector of an NPN transistor $Tr_0$, an emitter is connected to a base of the NPN transistor $Tr_0$, and a collector is connected to a second power supply terminal 15. A power supply suitable for compensating the base current of the NPN transistor $Tr_0$ is impressed to the second power supply terminal 15.

In the aforementioned driving circuit according to the third embodiment, a base current of a transistor having a large $h_{fe}$ is sufficiently smaller than a collector current. Thus, an equation “reference current $I_{ref}$=collector current $I_c$” can be defined by ignoring the base current. However, if the base current can not be ignored, the collector current $I_c$ of the NPN transistor $Tr_0$ can be made closer to the reference current $I_{ref}$ by adding the base current compensating circuit constituted by the NPN transistor $Tr_x$.

Also, a second current mirror circuit 20*c* is configured such that a PNP transistor $Tr_y$ serving as a base current compensating circuit is added to the second current mirror circuit 20*b* of the driving circuit according to the third embodiment.

A base of the PNP transistor $Tr_y$ is connected to a collector of a PNP transistor $Tr_a$, an emitter is connected to a base of the PNP transistor $Tr_a$, and a collector is connected to a ground terminal 14.

The addition of the base current compensating circuit constituted by the PNP transistor $Tr_y$ enables collector current $I_c$ to be closer to the reference current $I_{ref}$ even if the base current can not be ignored, as mentioned above.

As mentioned above, according to the driving circuit of the fourth embodiment of the present invention, the current flowing through the reference current input terminal 12 can be made coincident with the output current outputted from the output terminals $O_1$ to $O_n$ with the high accuracy. Also, the current flowing through the collector of the NPN transistor $Tr_{n+1}$ arranged at the final stage of the first current mirror circuit 10*c* can be made coincident with the current flowing through the reference current output terminal 13 with the high accuracy. Thus, it is possible to carry out the precise current control.

Figure 12:
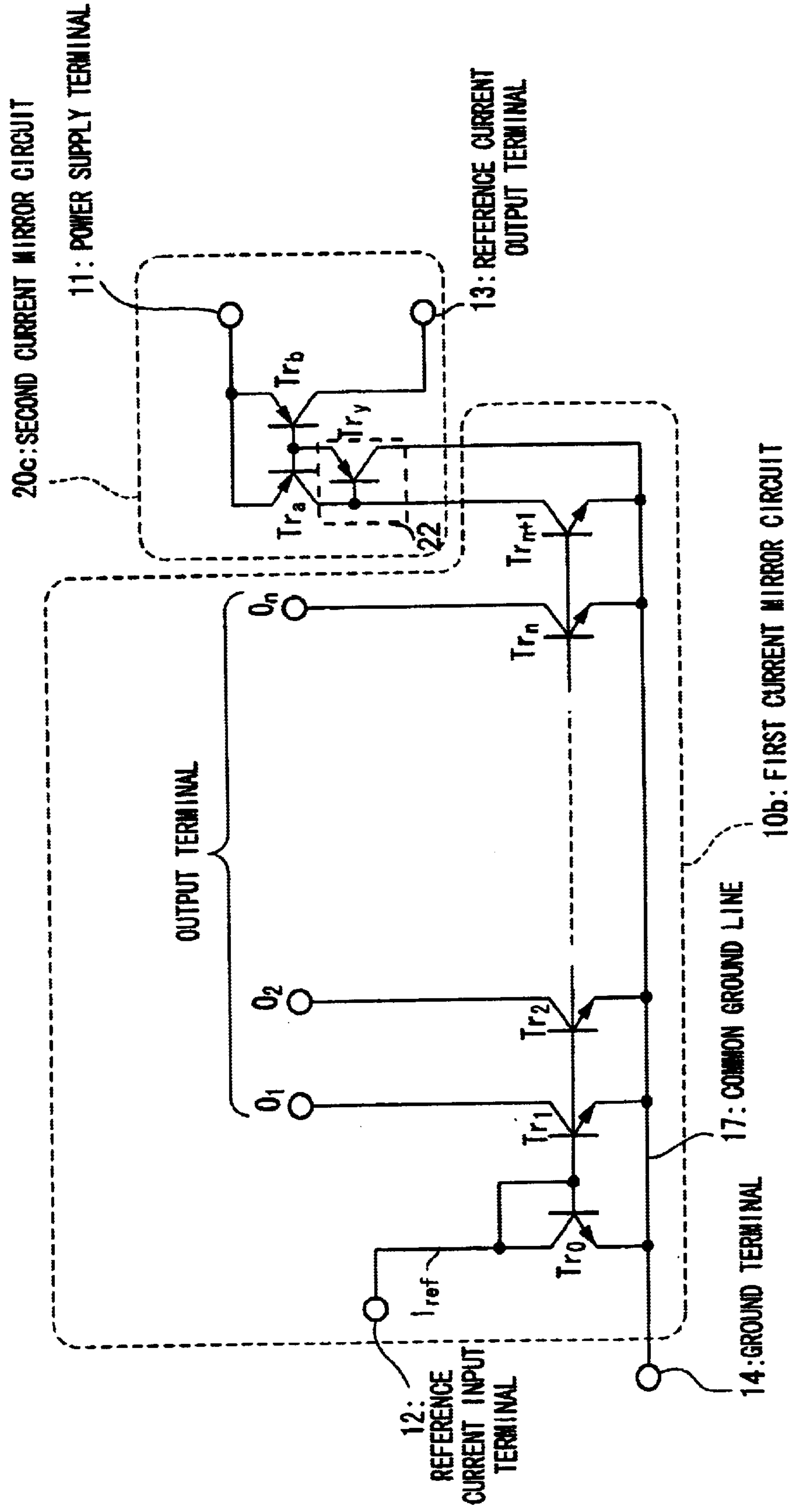
FIG. 12 is a circuit diagram showing a first variation of the driving circuit according to the fourth embodiment of the present invention.
Figure 13:
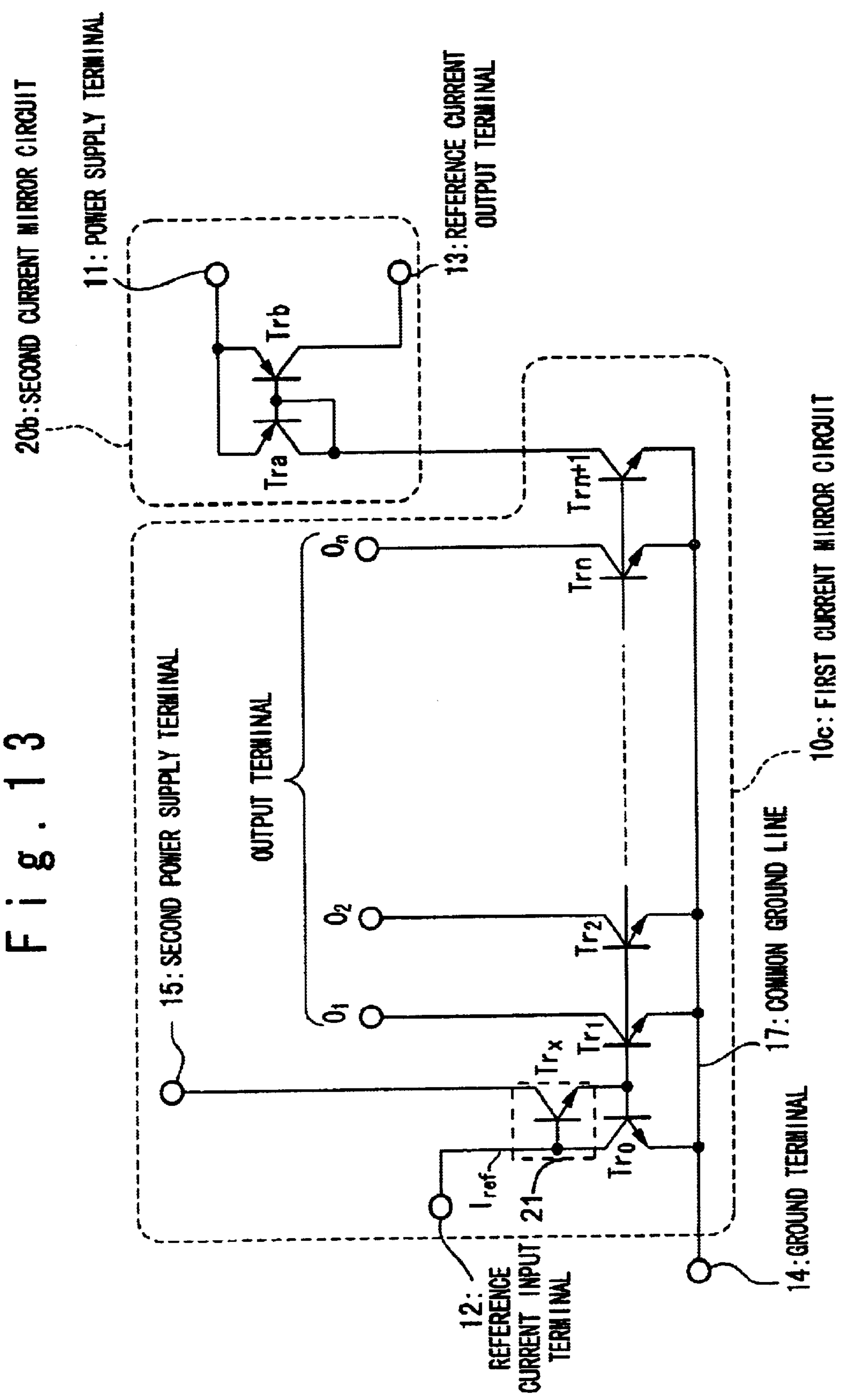
FIG. 13 is a circuit diagram showing a second variation of the driving circuit according to the fourth embodiment of the present invention.

It should be noted that the fourth embodiment is designed such that the base current compensating circuit is installed in each of the first current mirror circuit 10*c* and the second current mirror circuit 20*c*. However, as shown in FIG. 12, the base current compensating circuit may be installed only in the second current mirror circuit 20*c*. Also, as shown in FIG. 13, the base current compensating circuit may be installed only in the first current mirror circuit 10*c*.

(Fifth Embodiment)

A driving circuit according to a fifth embodiment of the present invention is designed such that a current mirror circuit of a current discharging type, which discharges a current from an output terminal, is constituted by MOS transistors. It should be noted that this embodiment will be described below by giving the symbols similar to those of the first embodiment to the portions corresponding to the first embodiment.

FIG. 14 is a circuit diagram showing the detailed circuit configuration of the driving circuit according to the fifth embodiment of the present invention. This driving circuit is composed of a first current mirror circuit 10*d* and a second current mirror circuit 20*d*.

The first current mirror circuit 10*d* outputs the output currents corresponding to an reference current $I_{ref}$ which is supplied from the reference current input terminal 12, from the output terminals $O_1$ to $O_n$. Also, one of the output currents from the first current mirror circuit 10*d* is supplied to the second current mirror circuit 20*d*. The second current mirror circuit 20*d* converts a polarity of the output current outputted from the first current mirror circuit 10*d*, and outputs it from the reference current output terminal 13.

In detail, the first current mirror circuit 10*d* is composed of a plurality of P-channel MOS transistors (hereafter, referred to as "PMOS transistor") $Tr_0$ to $Tr_{n+1}$. The PMOS transistor $Tr_0$ corresponds to the first circuit of the present invention, the plurality of PMOS transistors $Tr_1$ to $Tr_n$ correspond to the plurality of second circuits of the present invention, and the PMOS transistor $Tr_{n+1}$ corresponds to the third circuit of the present invention.

In this first current mirror circuit 10*d*, the power supply terminal 11 and the PMOS transistors $Tr_0$ to $Tr_{n+1}$ are physically arranged at positions shown in FIG. 11. In short, the PMOS transistor $Tr_0$ is physically arranged at the closest position to the power supply terminal 11, and the PMOS transistor $Tr_{n+1}$ is physically arranged at the farthest position from the power supply terminal 11.

Respective gates of the plurality of PMOS transistors $Tr_0$ to $Tr_{n+1}$ are connected to each other. Sources are commonly connected to each other through the common power supply line 16, which is extendedly located from the power supply terminal 11. The gate of the PMOS transistor $Tr_0$ arranged at a first stage of the first current mirror circuit 10*d* is connected to a drain thereof.

A drain of the PMOS transistor $Tr_{n+1}$ arranged at a final stage is connected to the second current mirror circuit 20*d*. Drains of the PMOS transistors $Tr_1$ to $Tr_n$ arranged at middle stages are connected to the output terminals $O_1$ to $O_n$, respectively.

The second current mirror circuit 20*d* is composed of an N-channel MOS transistor (hereafter, referred to as "NMOS Transistor") $Tr_a$ and an NMOS transistor $Tr_b$. A gate of the NMOS transistor $Tr_a$ is connected to a drain. A source of the NMOS transistor $Tr_a$ is connected to the ground terminal 14. Also, a gate of the NMOS transistor $Tr_b$ is connected to the gate of the NMOS transistor $Tr_a$, a drain thereof is connected to the reference current output terminal 13, and a source thereof is connected to the ground terminal 14.

A current substantially equal to that flowing through the NMOS transistor $Tr_a$ flows through this NMOS transistor $Tr_b$. In this case, a direction of the current flowing through the NMOS transistor $Tr_b$ is equal to that of the current flowing through the NMOS transistor $Tr_a$. Thus, since the NMOS transistor $Tr_b$ functions so as to suck the current, the polarity of the current outputted from the NMOS transistor $Tr_{n+1}$ is converted such that the polarity is inverted.

The operation of the driving circuit having the above-mentioned configuration is equal to that of the driving circuit according to the first embodiment except that the PNP transistors and the NPN transistors are replaced by the PMOS transistors and the NMOS transistors, respectively. Even the driving circuit according to this fifth embodiment can provide the effect similar to that of the first embodiment.

(Sixth Embodiment)

A driving circuit according to a sixth embodiment of the present invention is designed such that a current mirror circuit of a current sucking type, which sucks a current from an output terminal, is constituted by MOS transistors. It should be noted that this embodiment will be described below by giving the symbols similar to those of the first embodiment to the portions corresponding to the first embodiment.

FIG. 15 is a circuit diagram showing the detailed circuit configuration of the driving circuit according to the sixth embodiment of the present invention. This driving circuit is composed of a first current mirror circuit 10*e* and a second current mirror circuit 20*e*.

The first current mirror circuit 10*e* is composed of a plurality of NMOS transistors $Tr_0$ to $Tr_{n+1}$. The NMOS transistor $Tr_0$ corresponds to a first circuit of the present invention, a plurality of NMOS transistors $Tr_0$ to $Tr_n$ correspond to a plurality of second circuits of the present invention, and an NMOS transistor $Tr_{n+1}$ corresponds to a third circuit of the present invention.

In this first current mirror circuit 10*e*, the ground terminal 14 and the NMOS transistors $Tr_0$ to $Tr_{n+1}$ are physically arranged at positions shown in FIG. 15. In short, the NMOS transistor $Tr_0$ is physically arranged at the closest position to the ground terminal 14, and the NMOS transistor $Tr_{n+1}$ is physically arranged at the farthest position from the ground terminal.

Respective gates of the plurality of NMOS transistors $Tr_0$ to $Tr_{n+1}$ are connected to each other. Sources are commonly connected to each other through a common ground line 17 extendedly located from the ground terminal 14. The gate of the NMOS transistor $Tr_0$ arranged at a first stage of the first current mirror circuit 10*e* is connected to a drain thereof.

A drain of the NMOS transistor $Tr_{n+1}$ arranged at a final stage is connected to the second current mirror circuit 20*e*. Drains of the NMOS transistors $Tr_1$ to $Tr_n$ arranged at the middle stages are connected to the output terminals $O_1$ to $O_n$, respectively.

The second current mirror circuit 20*e* is composed of a PMOS transistor $Tr_a$ and a PMOS transistor $Tr_b$. A gate of the PMOS transistor $Tr_a$ is connected to a drain. A source of the PMOS transistor $Tr_a$ is connected to the power supply terminal 11. Also, a gate of the PMOS transistor $Tr_b$ is connected to the gate of the PMOS transistor $Tr_a$, a drain thereof is connected to the reference current output terminal 13, and a source thereof is connected to the power supply terminal 11.

A current substantially equal to that flowing through the PMOS transistor $Tr_a$ flows through this PMOS transistor $Tr_b$. In this case, a direction of the current flowing through the PMOS transistor $Tr_b$ is equal to that of the current flowing through the PMOS transistor $Tr_a$. Thus, since the PMOS transistor $Tr_b$ functions so as to discharge the current, the polarity of the current outputted from the NMOS transistor $Tr_{n+1}$ is converted such that the polarity is inverted.

The operation of the driving circuit having the above-mentioned configuration is equal to that of the driving circuit according to the third embodiment except that the NMOS transistors and the PMOS transistors are exchanged.

According to the driving circuit of the sixth embodiment of the present invention, it is possible to drive the light emission device having the current discharging type. Also, similarly to the third embodiment, if a constant current driving apparatus configured by using the plurality of driving circuits is applied to the display panel, there is not a substantial brightness difference in a boundary between a light emission device driven by one driving circuit and a light emission device driven by another driving circuit adjacent thereto. Hence, it is possible to attain the picture having the high quality (Seventh Embodiment)

In a driving circuit according to a seventh embodiment of the present invention, the physical position of the power supply terminal of the first current mirror circuit of the driving circuit according to the first embodiment is changed.

Figure 16:
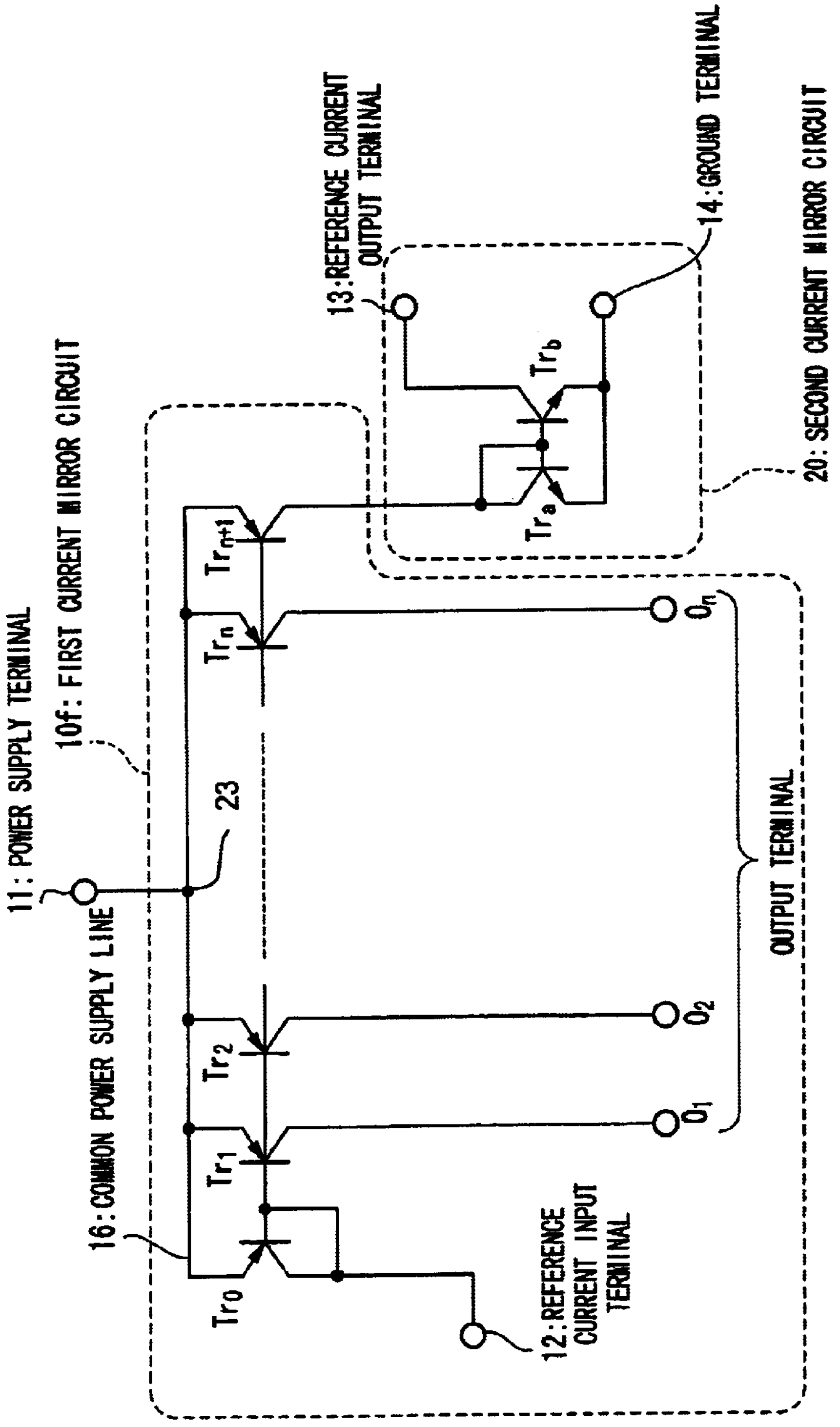
FIG. 16 is a circuit diagram showing a configuration of a driving circuit according to a seventh embodiment of the present invention.

FIG. 16 is a circuit diagram showing a configuration of the driving circuit according to the seventh embodiment of the present invention. This driving circuit is equal to that of the first embodiment except that the power supply terminal 11 is disposed at a physical center 23 of a common power supply line 16 through which emitters of NPN transistors $Tr_o$ to $T_{n+1}$ are connected to each other. Here, the center 23 implies a portion between a first portion where the emitter of the PNP transistors $Tr_o$ is formed and a second portion where the emitter of the PNP transistor $Tr_{n+1}$ is formed. Preferably, the center 23 may be located at a substantial center between the first portion and the second portion.

According to this configuration, an output current outputted from the output terminal at the center 23 out of output currents outputted from the output terminals $O_l$ to $O_n$ of the driving circuit is the largest. The output currents become gradually smaller toward the side of the output terminal $O_l$ and the side of the output terminal $O_n$. That is, they form a shape of a mountain.

Figure 6C:
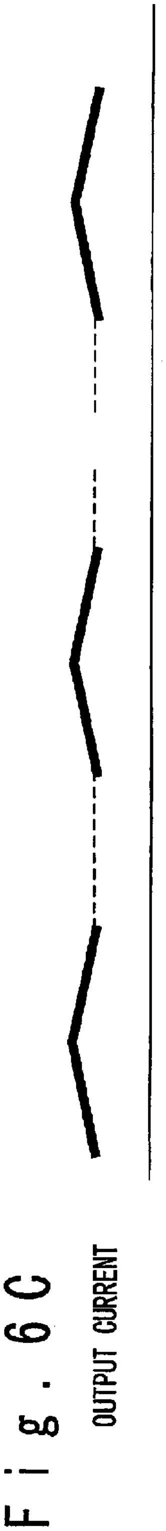
FIG. 6C is explanatory diagrams describing an operation of a constant current driving apparatus using the driving circuit according to the seventh embodiment of the present invention.

Thus, when the N driving circuits according to this seventh embodiment are used to configure a constant current driving apparatus, the output currents outputted from the output terminals $O_1$ to $O_n$ of the respective driving circuits form a shape of the continuous mountains, as shown in FIG. 6C.

According to this configuration, the output currents in the boundary between the driving circuits adjacent to each other are substantially equal. Thus, if this constant current driving apparatus is applied to a display panel, the picture having the high quality can be obtained similarly to the first embodiment. Moreover, a difference between the output current from the first driving circuit and the output current from the N-th driving circuit is smaller as compared with the case when the N driving circuits according to the first embodiment are used to configure the constant current driving apparatus. Hence, when this constant current driving apparatus is applied to the display panel, a difference between a brightness of one end of a screen and a brightness of another end is small to accordingly generate the picture having the high quality.

It should be noted that the driving circuit according to the fifth embodiment can be also configured so as to pull out the power supply terminal 11 from the center 23 of the common power supply line 16. Also, the third and fourth embodiments can be configured so as to pull out the ground terminal 14 from the center 25 of the common ground line 17. All of the cases can provide the effects similar to the above-mentioned effects.

Figure 17:
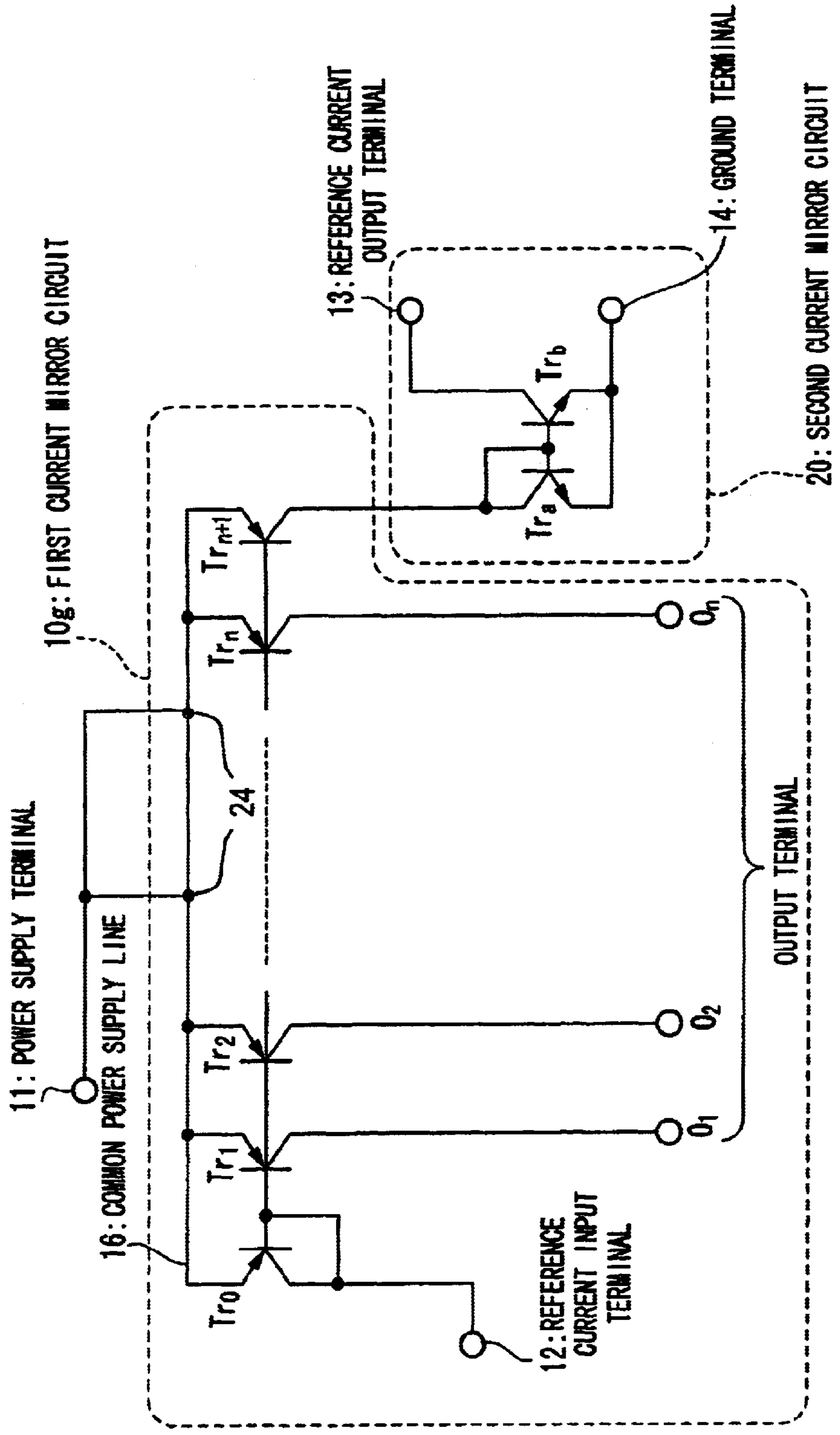
FIG. 17 is a circuit diagram showing a configuration of a variation of the driving circuit according to the seventh embodiment of the present invention.

FIG. 17 is a circuit diagram showing a configuration of a variation of the driving circuit according to the seventh embodiment of the present invention. This driving circuit is equal to that of the first embodiment except that the power supply terminal 11 is pulled out from a plurality of positions 24 of the common power supply line 16 through which the PNP transistors $Tr_o$ to $Tr_{n+l}$ are connected. This case can be configured such that the common power supply line 16 is divided into m components ("m" is an integer equal to or greater than 3) and (m−1) wires are pulled out from the respective divided points 24 and connected to the power supply terminal 11. FIG. 17 shows an example of a case of "m=3". It should be noted that when the common power supply line 16 is divided into the m components, it is desired to be divided such that a length of a division piece at each of both ends among the m division pieces becomes half that of the division piece except both ends. For example, in the example of "m=3" shown in FIG. 17, the common power supply line 16 is desired to be divided at a rate of 1:2:1. However, it is not always necessary to divide the common power supply line 16 as mentioned above.

According to this configuration, the output currents outputted from the output terminals $O_1$ to $O_n$ of the driving circuit form a shape in which a plurality of mountains are continuous, with the output currents outputted from the output terminals located at the plurality of division points as the tops of the mountains.

When the N driving circuits according to this variation of the seventh embodiment are used to configure the constant current driving apparatus, the plurality of output currents, each of which has a plurality of mountain shapes, outputted from the output terminals $O_1$ to $O_n$ of each driving circuit are continues.

According to this configuration, the output currents in the boundary between the driving circuits adjacent to each other are substantially equal. Thus, if this constant current driving apparatus is applied to the display panel, the picture having the high quality can be obtained similarly to the first embodiment. Moreover, the difference between the output current from the first driving circuit and the output current from the N-th driving circuit is much smaller as compared with the above-mentioned case when it is pulled out from only one portion such as the center of the common power supply line 16. Hence, when this constant current driving apparatus is applied to the display panel, the difference between a brightness of one end of the screen and a brightness of another end is smaller to thereby generate the picture having the high quality.

It should be noted that the driving circuit according to the fifth embodiment can be also configured so as to pull out the power supply terminal 11 from the plurality of positions 24 of the common power supply line 16. Also, the third and fourth embodiments can be configured so as to pull out the ground terminal 14 from the plurality of positions 26 of the common ground line 17. All of these cases can provide the effects similar to the above-mentioned effects provided by the variation of the seventh embodiment.

As mentioned above, in the driving circuit according to the first to seventh embodiments, the output current at the final stage of the driving circuit of the former stage is used as the input current of the current mirror circuit constituting the driving circuit of the next stage. Thus, even when the plurality of driving circuits are connected, it is possible to reduce the variation of the current in the boundary between the driving circuits. Also, when this driving circuit is constituted by the semiconductor integrated circuit, the cost of the driving circuit can be reduced.

Also, when the constant current driving apparatus using the driving circuit according to the first to seventh embodiments of the present invention is applied to a display such as an organic EL or the like, it is possible to reduce the variation in the brightness caused by the variation in the output current in the boundary between the driving circuits. Thus, it is possible to provide the picture having the high quality.

As detailed above, according to the present invention, it is possible to provide the inexpensive constant current driving apparatus in which the variation in the output current can be reduced between the driving circuits adjacent to each other.

What is claimed is:

1. A driving circuit comprising:

a first current mirror circuit which outputs a plurality of output currents each of which corresponds to a reference current, said first current mirror circuit comprising:

a reference current input terminal to which said reference current is supplied;

a power supply terminal to which power is supplied;

a first circuit provided between said reference current input terminal and said power supply terminal, to determine said plurality of output currents;

a common power supply line which extends from said power supply terminal;

a plurality of output terminals;

a plurality of second circuits provided between said common power supply line and said plurality of output terminals, to output a part of said plurality of output currents determined by said first circuit through said plurality of output terminals; and a third circuit provided at a next state of said plurality of second circuits as said final stage of said first current mirror circuit, to output said output current determined by said first circuit; and a second current mirror circuit which converts a polarity of an output current outputted from a final stage of said first current mirror circuit and outputs the converted output current, said second current mirror circuit converting said polarity of said output current outputted from said third circuit and outputs said converted output current through a reference current output terminal, wherein:

said first circuit, said second circuits and said third circuit included in said first current mirror circuit comprise PNP transistors, and said second current mirror circuit comprises NPN transistors, at least one of said first current mirror circuit and said second current mirror circuit includes a base current compensating circuit, and said power supply terminal is pulled out from a center of said common power supply line.

2. A driving circuit comprising:

a first current mirror circuit which outputs a plurality of output currents each of which corresponds to a reference current, said first current mirror circuit comprising:

a reference current input terminal to which said reference current is supplied;

a power supply terminal to which power is supplied;

a first circuit provided between said reference current input terminal and said power supply terminal, to determine said plurality of output currents;

a common power supply line which extends from said power supply terminal;

a plurality of output terminals;

a plurality of second circuits provided between said common power supply line and said plurality of output terminals, to output a part of said plurality of output currents determined by said first circuit through said plurality of output terminals; and a third circuit provided at a next stage of said plurality of second circuits as said final stage of said first current mirror circuit, to output said output current determined by said first circuit; and a second current mirror circuit which converts a polarity of an output current outputted from a final stage of said first current mirror circuit and outputs the converted output current, said second current mirror circuit converting said polarity of said output current outputted from said third circuit and outputs said converted output current through a reference current output terminal, wherein:

said first circuit, said second circuits and said third circuit included in said first current mirror circuit comprise PNP transistors, and said second current mirror circuit comprises NPN transistors, at least one of said first current mirror circuit and said second current mirror circuit includes a base current compensator circuit, and said power supply terminal is pulled out from a plurality of positions of said common power supply line.

3. A driving circuit comprising:

a first current mirror circuit which outputs a plurality of output currents each of which corresponds to a reference current; and a second current mirror circuit which converts a polarity of an output current outputted from a final stage of said first current mirror circuit and outputs the converted output current, wherein:

said first current mirror circuit comprises:

a reference current input terminal to which said reference current is supplied;

a ground terminal which is connected to a ground;

a first circuit provided between said reference current input terminal and said ground terminal, to determine said plurality of output currents;

a common ground line which extends from said ground terminal;

a plurality of output terminals;

a plurality of second circuits provided between said common ground line and said plurality of output terminals, to output a part of said plurality of output currents determined by said first circuit through said plurality of output terminals; and a third circuit provided at a next stage of said plurality of second circuits as said final stage of said first current mirror circuit, to output said output current determined by said first circuit, said second current mirror circuit converts said polarity of said output current outputted from said third circuit and outputs said converted output current through a reference current output terminal, said first circuit, said second circuits and said third circuit included in said first current mirror circuit comprise NPN transistors, and said second current mirror circuit comprises PNP transistors, at least one of said first current mirror circuit and said second current mirror circuit includes a base current compensating circuit, and said ground terminal is pulled out from a center of said common ground line.

4. A driving circuit comprising:

a first current mirror circuit which outputs a plurality of output currents each of which corresponds to a reference current; and a second current mirror circuit which converts a polarity of an output current outputted from a final stage of said first current mirror circuit and outputs the converted output current, wherein:

said first current mirror circuit further comprises:

a reference current input terminal to which said reference current is supplied;

a ground terminal which is connected to a ground;

a first circuit provided between said reference current input terminal and said ground terminal, to determine said plurality of output currents;

a common ground line which extends from said ground terminal;

a plurality of output terminals;

a plurality of second circuits provided between said common ground line and said plurality of output terminals, to output a part of said plurality of output currents determined by said first circuit through said plurality of output terminals; and a third circuit provided at a next stage of said plurality of second circuits as said final stage of said first current mirror circuit, to output said output current determined by said first circuit, said second current mirror circuit converts said plurality of said output current outputted from said third circuit and outputs said converted output current through a reference current output terminal, said first circuit, said second circuits and said third circuit included in said first current mirror circuit comprise NPN transistors, and said second current mirror circuit comprises PNP transistors, at least one of said first current mirror circuit and said second current mirror circuit includes a base current compensating circuit, and said ground terminal is pulled out from a plurality of positions of said common ground line.

5. A constant current driving apparatus comprising a plurality of driving circuits connected through terminals in series, each of which comprises:

a first current mirror circuit which outputs a plurality of output currents each of which corresponds to a reference current; and a second current mirror circuit which converts a polarity of an output current outputted from a final stage of said first current mirror circuit and outputs the converted output current.

6. The constant current driving apparatus according to claim 5, wherein said first current mirror circuit comprises:

a reference current input terminal to which said reference current is supplied;

a power supply terminal to which power is supplied;

a first circuit provided between said reference current input terminal and said power supply terminal, to determine said plurality of output currents;

a common power supply line which extends from said power supply terminal;

a plurality of output terminals;

a plurality of second circuits provided between said common power supply line and said plurality of output terminals, to output a part of said plurality of output currents determined by said first circuit through said plurality of output terminals; and a third circuit provided at a next stage of said plurality of second circuits as said final stage of said first current mirror circuit, to output said output current determined by said first circuit.

7. The constant current driving apparatus according to claim 6, wherein said second current mirror circuit converts said polarity of said output current outputted from said third circuit and outputs said converted output current through a reference current output terminal.

8. The constant current driving apparatus according to claim 7, wherein said first circuit, said second circuits and said third circuit included in said first current mirror circuit comprise PNP transistors, and said second current mirror circuit comprises NPN transistors.

9. The constant current driving apparatus according to claim 8, wherein at least one of said first current mirror circuit and said second current mirror circuit includes a base current compensating circuit.

10. The constant current driving apparatus according to claim 7, wherein said first circuit, said second circuits and said third circuit included in said first current mirror circuit comprise P-channel MOS transistors, and said second current mirror circuit comprises N-channel MOS transistors.

11. The constant current driving apparatus according to claim 5, wherein said first current mirror circuit comprises:

a reference current input terminal to which said reference current is supplied;

a ground terminal which is connected to a ground;

a first circuit provided between said reference current input terminal and said ground terminal, to determine said plurality of output currents;

a common ground line which extends from said ground terminal;

a plurality of output terminals;

a plurality of second circuits provided between said common ground line and said plurality of output terminals, to output a part of said plurality of output currents determined by said first circuit through said plurality of output terminals; and a third circuit provided at a next stage of said plurality of second circuits as said final stage of said first current mirror circuit, to output said output current determined by said first circuit.

12. The constant current driving apparatus according to claim 11, wherein said second current mirror circuit converts said polarity of said output current outputted from said third circuit and outputs said converted output current through a reference current output terminal.

13. The constant current driving apparatus according to claim 12, wherein said first circuit, said second circuits and said third circuit included in said first current mirror circuit comprise NPN transistors, and said second current mirror circuit comprises PNP transistors.

14. The constant current driving apparatus according to claim 13, wherein at least one of said first current mirror circuit and said second current mirror circuit includes a base current compensating circuit.

15. The constant current driving apparatus according to claim 12, wherein said first circuit, said second circuits and said third circuit included in said first current mirror circuit comprise N-channel MOS transistors, and said second current mirror circuit comprises P-channel MOS transistors.

* * * * *